US012628624B2

(12) United States Patent
Han et al.

(10) Patent No.: US 12,628,624 B2
(45) Date of Patent: May 12, 2026

(54) MANUFACTURING METHOD FOR FORMING SEMICONDUCTOR DEVICE

(71) Applicant: TAIWAN SEMICONDUCTOR MANUFACTURING COMPANY, LTD., Hsinchu (TW)

(72) Inventors: Jhih-Yong Han, Yunlin County (TW); Wen-Yen Chen, Hsinchu City (TW); Po-Kang Ho, Taoyuan City (TW); Tsai-Yu Huang, Taoyuan City (TW); Huicheng Chang, Tainan City (TW); Yee-Chia Yeo, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 953 days.

(21) Appl. No.: 17/672,144

(22) Filed: Feb. 15, 2022

(65) Prior Publication Data

US 2023/0260804 A1     Aug. 17, 2023

(51) Int. Cl.
H01L 21/324 (2006.01)
H01L 21/265 (2006.01)
H10D 30/01 (2025.01)

(52) U.S. Cl.
CPC ...... H01L 21/324 (2013.01); H01L 21/26513 (2013.01); H10D 30/0227 (2025.01)

(58) Field of Classification Search
CPC ....... H01L 29/36–365; H01L 21/0257–02584; H01L 21/04; H01L 21/04505; H01L 21/041; H01L 21/0415; H01L 21/045;

H01L 21/0455; H01L 21/046; H01L 21/0465; H01L 21/76858; H01L 21/76859; H01L 21/76864; H10D 62/121;
(Continued)

(56) References Cited

U.S. PATENT DOCUMENTS

2013/0157431 A1*  6/2013  Tsai .................. H01L 29/66545
                                                             257/E21.444
2022/0149176 A1*  5/2022  More .................. H01L 29/0653

OTHER PUBLICATIONS

Bonafos et al., "Ostwald ripening of end-of-range defects in silicon", Journal of Applied Physics, Mar. 15, 1998, vol. 83, No. 6, pp. 3008-3017.
(Continued)

*Primary Examiner* — Julio J Maldonado
*Assistant Examiner* — Stanetta D Isaac
(74) *Attorney, Agent, or Firm* — Birch, Stewart, Kolasch & Birch, LLP

(57) ABSTRACT

The method includes performing a well implantation process to dope a dopant into a semiconductor substrate; after performing the well implantation process, performing a flash anneal on the semiconductor substrate, the flash anneal including a first preheat step and a first annealing step after the first preheat step, the first preheat step performed at a preheat temperature ranging from about 200° C. to about 800° C., the first annealing step having a peak temperature ramp profile, the peak temperature ramp profile having a peak temperature ranging from about 1000° C. to about 1200° C.; after performing the flash anneal, performing a rapid thermal anneal (RTA) on the semiconductor substrate, the RTA including a second preheat step, the first preheat step of the flash anneal being performed for a shorter duration than the second preheat step of the RTA.

20 Claims, 21 Drawing Sheets

(58) Field of Classification Search
CPC .............. H10D 64/017; H10D 64/021; H10D 30/0227; H10D 30/797; H10D 30/43; H10D 30/6757; H10D 30/014; H10D 30/6735
See application file for complete search history.

(56) References Cited

OTHER PUBLICATIONS

Gossmann et al., "Oxidation enhanced diffusion in Si B-doping superlattices and Si self-interstitial diffusivities", Applied Physics Letters, Aug. 2, 1993, vol. 63, No. 5, pp. 639-641.

* cited by examiner

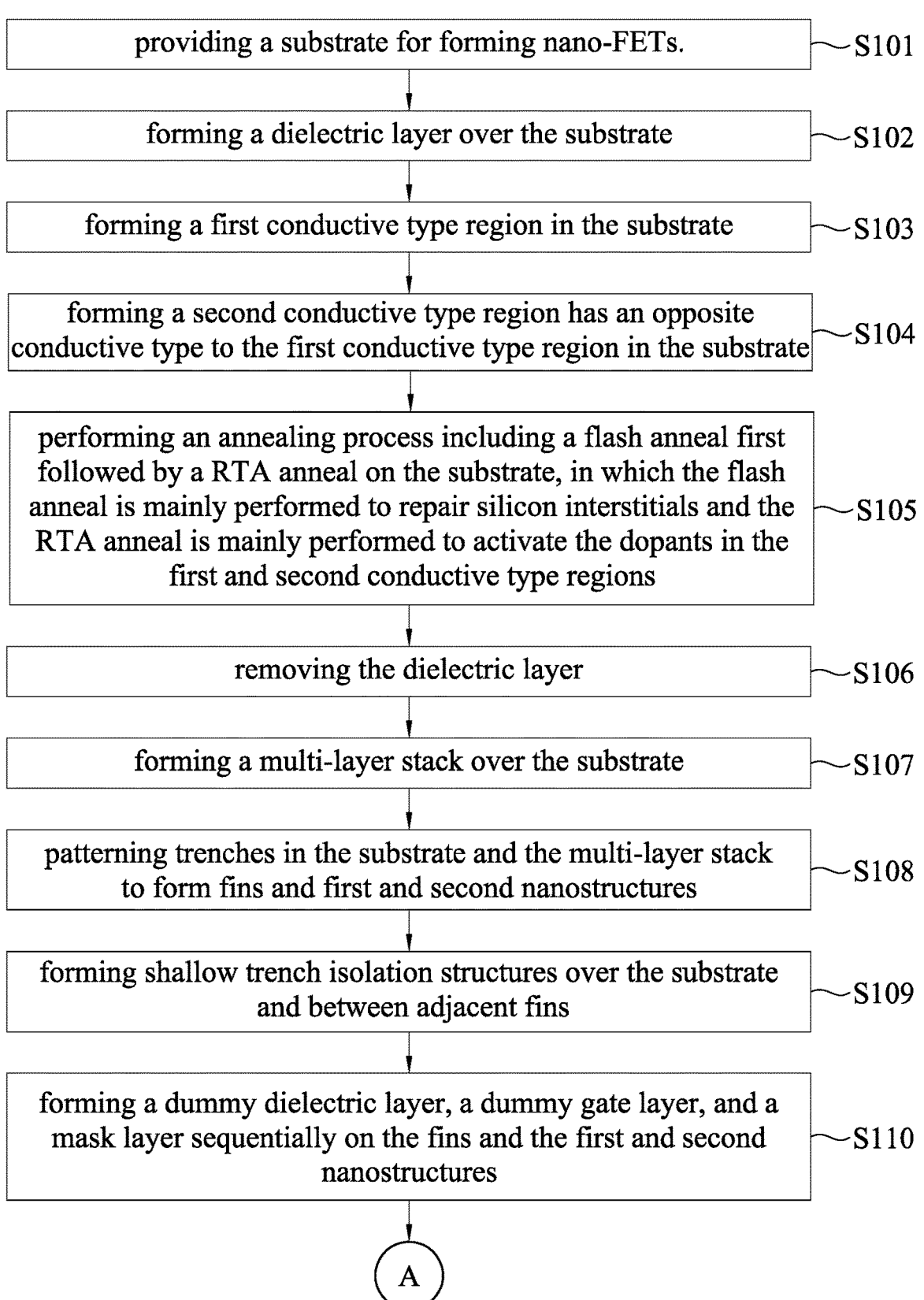

providing a substrate for forming nano-FETs. — S101 forming a dielectric layer over the substrate — S102 forming a first conductive type region in the substrate — S103 forming a second conductive type region has an opposite conductive type to the first conductive type region in the substrate — S104 performing an annealing process including a flash anneal first followed by a RTA anneal on the substrate, in which the flash anneal is mainly performed to repair silicon interstitials and the RTA anneal is mainly performed to activate the dopants in the first and second conductive type regions — S105 removing the dielectric layer — S106 forming a multi-layer stack over the substrate — S107 patterning trenches in the substrate and the multi-layer stack to form fins and first and second nanostructures — S108 forming shallow trench isolation structures over the substrate and between adjacent fins — S109 forming a dummy dielectric layer, a dummy gate layer, and a mask layer sequentially on the fins and the first and second nanostructures — S110

MANUFACTURING METHOD FOR FORMING SEMICONDUCTOR DEVICE

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B are a flowchart of a method for forming a semiconductor device in accordance with some embodiments of the present disclosure.

DETAILED DESCRIPTION

Figure 1:
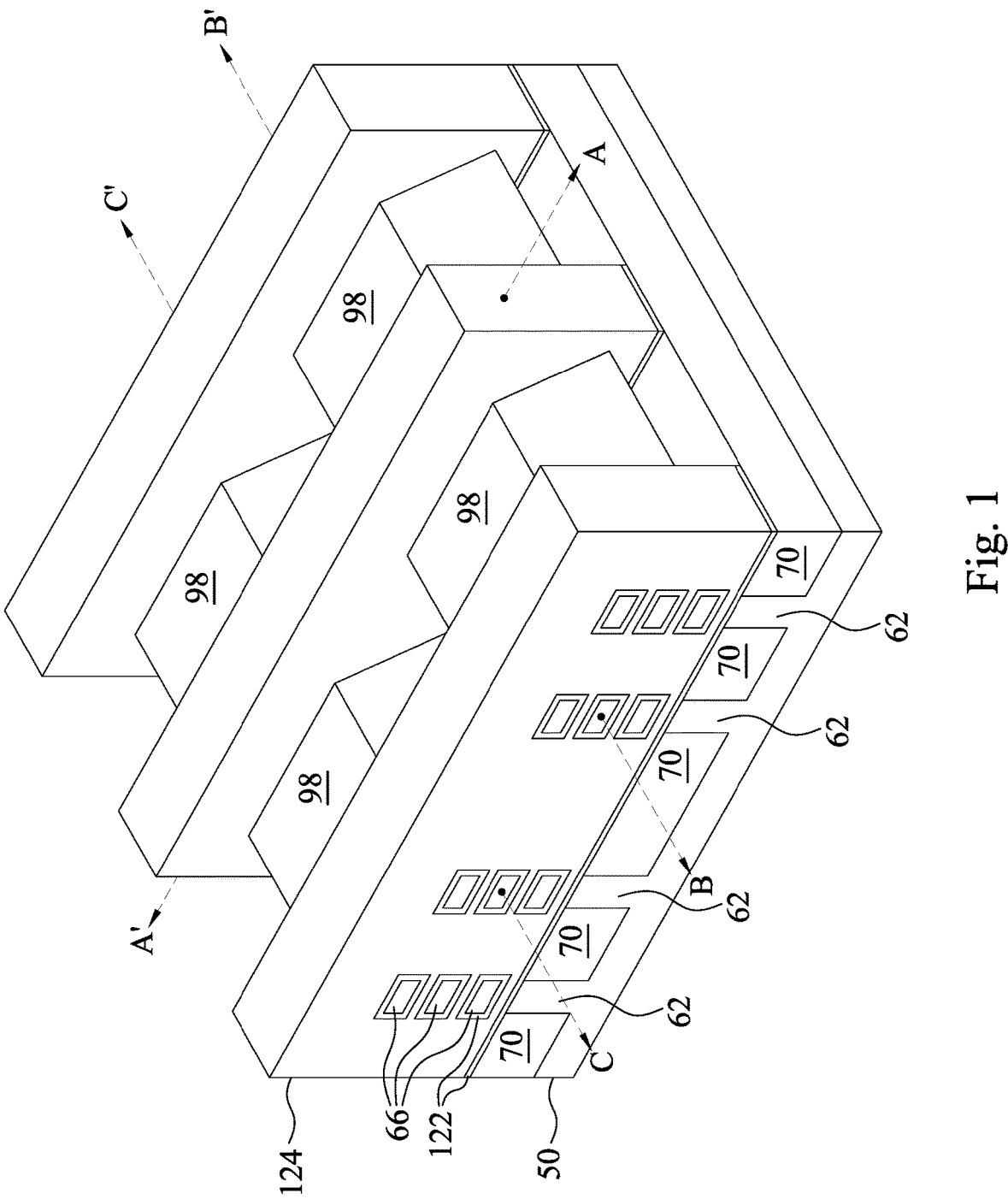
FIG. 1 illustrates an example of a nanostructure field-effect transistor (nano-FET) in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

In order to activate the dopants in wells of a semiconductor substrate, an annealing process may be performed on the well. However, if the annealing temperature stays in a mid-temperature regime (e.g., temperature about 700-1000° C.) for longer than about 10 seconds, silicon interstitial clustering will increase in the wells, resulting in dislocation loop formation. Once the dislocation loops have been formed, they will be difficult to be repaired, even if the anneal temperature is raised to higher than 1000° C. The dislocation loop formation results in defective well regions, which in turn will result in defective epitaxy structures that are formed on it subsequently, which in turn reduces the yield of the semiconductor device.

Therefore, the present disclosure in various embodiments provides an annealing process including a flash anneal first followed by a rapid thermal anneal (RTA) well anneal. The flash anneal is mainly performed to repair silicon interstitial defects, and the followed RTA is mainly performed to activate the dopants in the wells. Specifically, the flash anneal is performed with a shortened time duration in a mid-temperature regime (about 700-1000° C.), which can suppress silicon interstitial clustering and in turn allows for suppressing the dislocation loop formation and reducing an area density of dislocation loops.

FIG. 1 illustrates an example of nano-FETs (e.g., nanowire FETs, nanosheet FETs, or the like), in accordance with some embodiments. FIG. 1 is a three-dimensional view, where some features of the nano-FETs are omitted for illustration clarity. The nano-FETs may be nanosheet field-effect transistors (NSFETs), nanowire field-effect transistors (NWFETs), gate-all-around field-effect transistors (GAAFETs), or the like.

The nano-FETs include nanostructures 66 (e.g., nanosheets, nanowires, or the like) over fins 62 on a substrate 50 (e.g., a semiconductor substrate), with the nanostructures 66 acting as channel regions for the nano-FETs. The nanostructures 66 may include p-type nanostructures, n-type nanostructures, or a combination thereof. Isolation regions 70, such as shallow trench isolation (STI) regions, are disposed between adjacent fins 62, which may protrude above and from between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials. In this context, the fins 62 refer to the portion extending above and from between the adjacent isolation regions 70.

Gate dielectrics 122 are over top surfaces of the fins 62 and along top surfaces, sidewalls, and bottom surfaces of the nanostructures 66. Gate electrodes 124 are over the gate dielectrics 122. Epitaxial source/drain regions 98 are disposed on the fins 62 at opposing sides of the gate dielectrics 122 and the gate electrodes 124. The epitaxial source/drain regions 98 may be shared between various fins 62. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a gate electrode 124 and in a direction, for example, perpendicular to a direction of current flow between the epitaxial source/drain regions 98 of a nano-FET. Cross-section B-B' and Cross-section C-C' are along longitudinal axes of fins 62 and in directions of, for example, current flows between the epitaxial source/drain regions 98 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

Figure 2B:
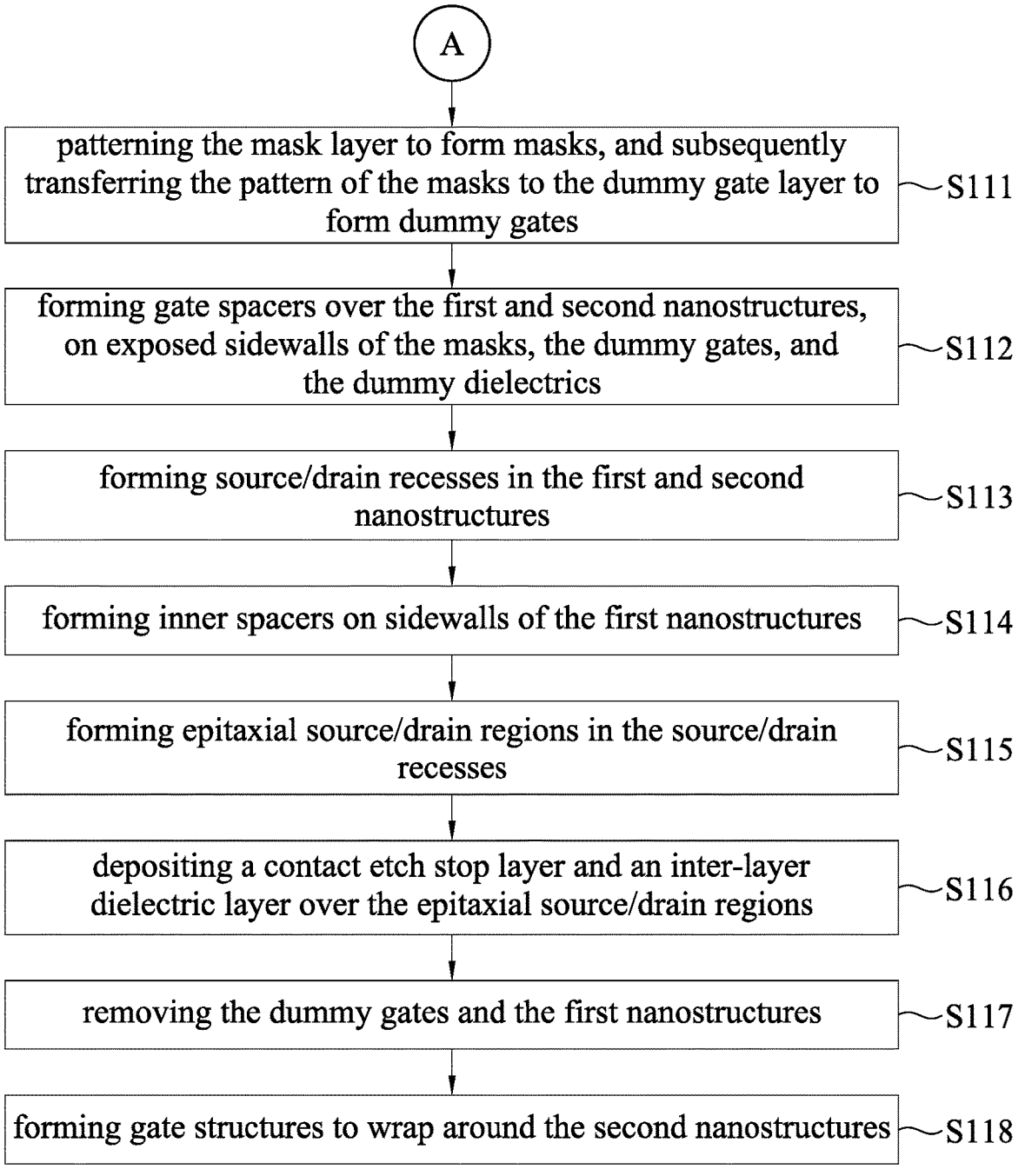

Referring now to FIGS. 2A and 2B, illustrated is a flowchart of an exemplary method M for fabrication of nano-FETs in accordance with some embodiments. The method M includes a relevant part of the entire manufacturing process. It is understood that additional operations may be provided before, during, and after the operations shown by FIGS. 2A and 2B, and some of the operations described below can be replaced or eliminated for additional embodiments of the method. The order of the operations/processes may be interchangeable. The method M includes fabrication of a nano-FETs. However, the fabrication of the nano-FETs is merely an example for describing the manufacturing process according to some embodiments of the present disclosure.

Figure 6:
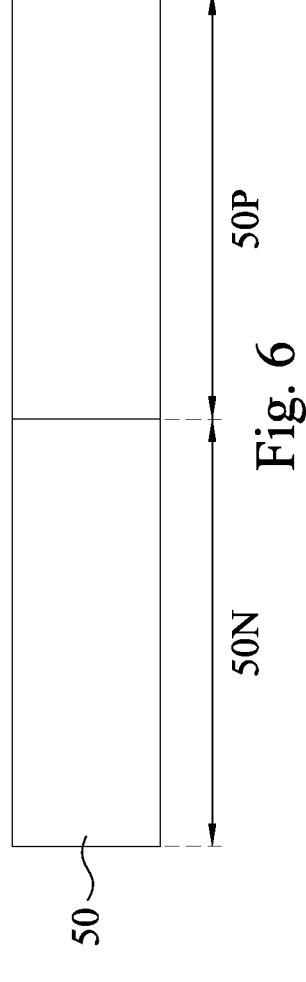
Figure 7A:
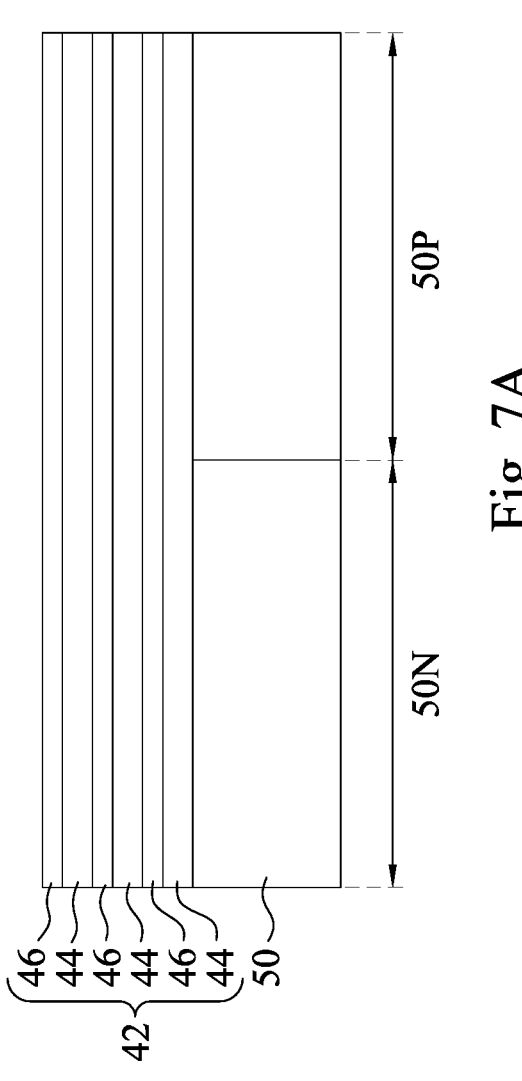
Figure 8:
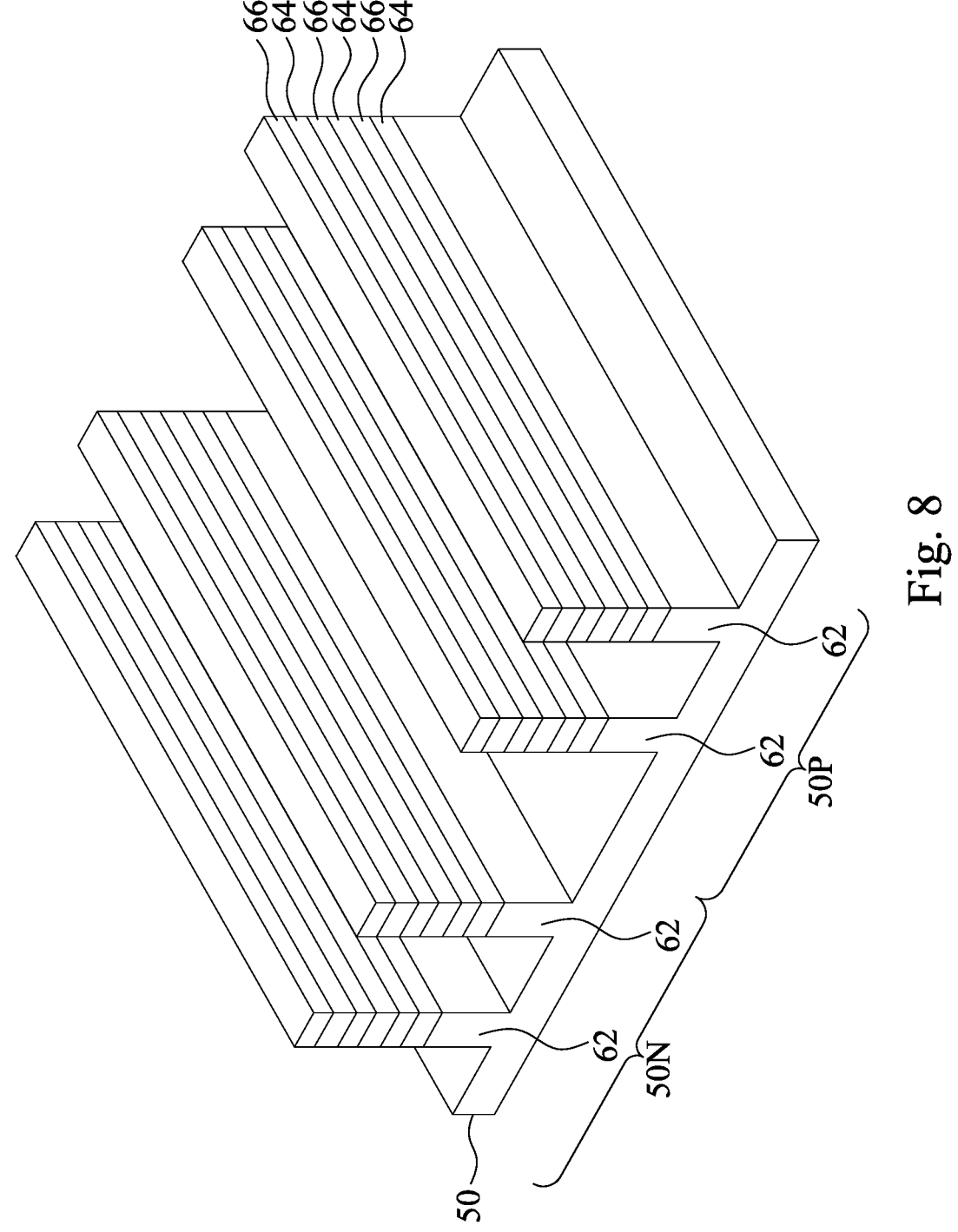
Figure 9:
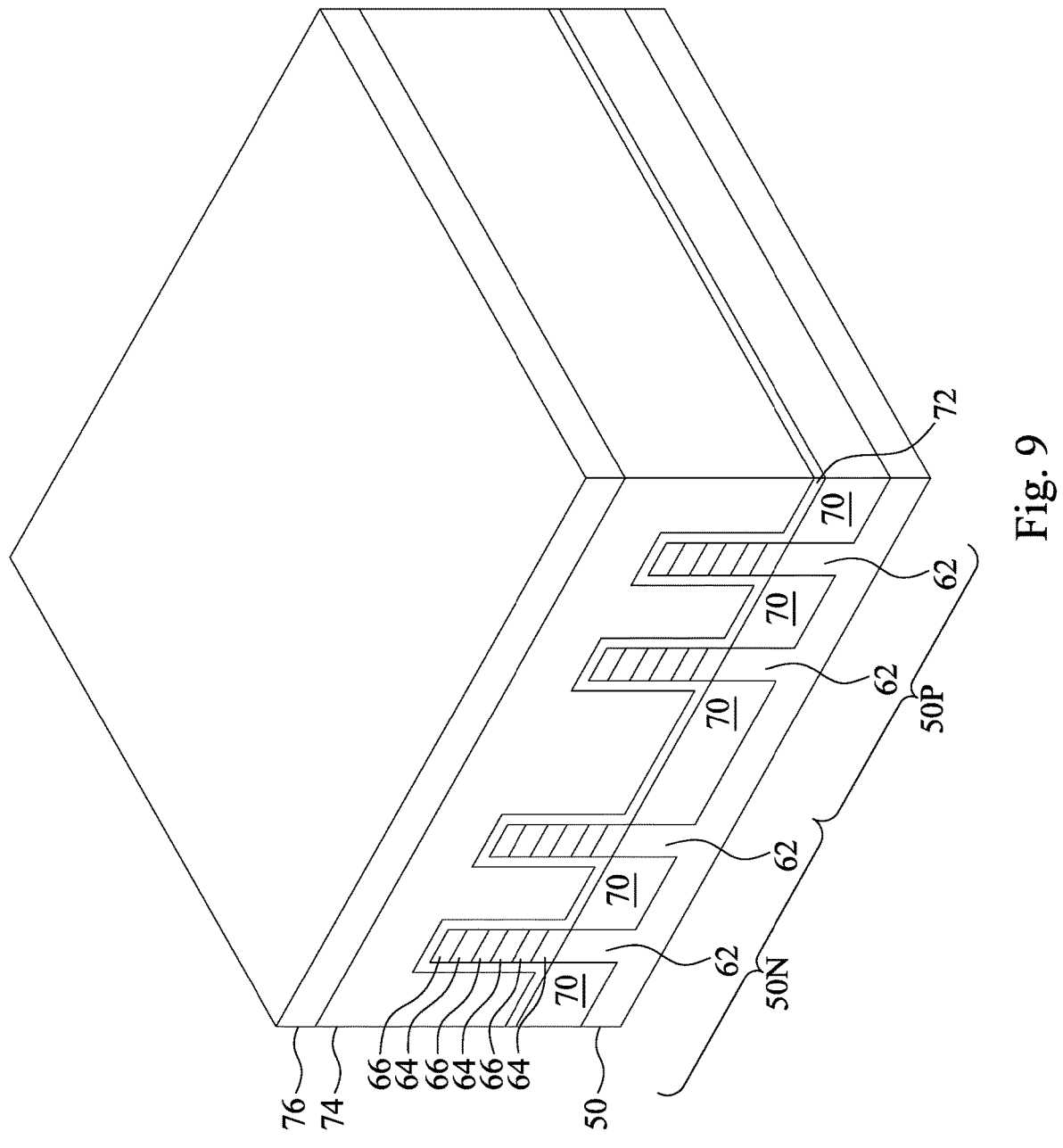
Figure 10:
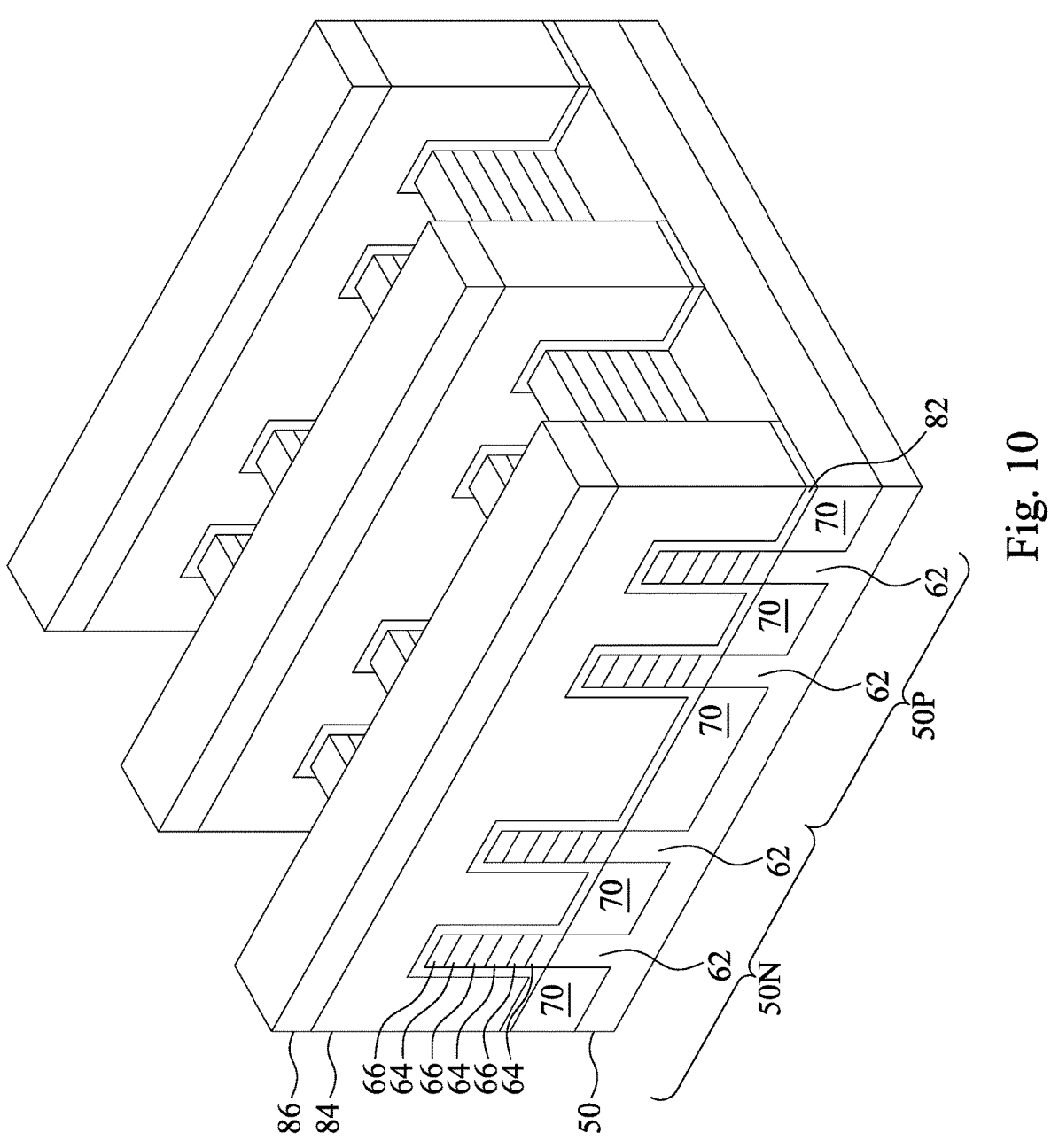

FIGS. 3-16B illustrate the method M in various stages of forming nano-FETs in accordance with some embodiments of the present disclosure. FIGS. 3A, 4A, 5A, 6, and 7A illustrate reference cross-section A-A' illustrated in FIG. 1. FIGS. 8, 9, and 10 are three-dimensional views showing a similar three-dimensional view as FIG. 1. FIGS. 11A, 12A, 13A, 14A, 15A, and 16A illustrate reference cross-section B-B' illustrated in FIG. 1. FIGS. 11B, 12B, 13B, 14B, 15B, and 16B illustrate reference cross-section C-C' illustrated in FIG. 1.

Figures 3A, 3B:
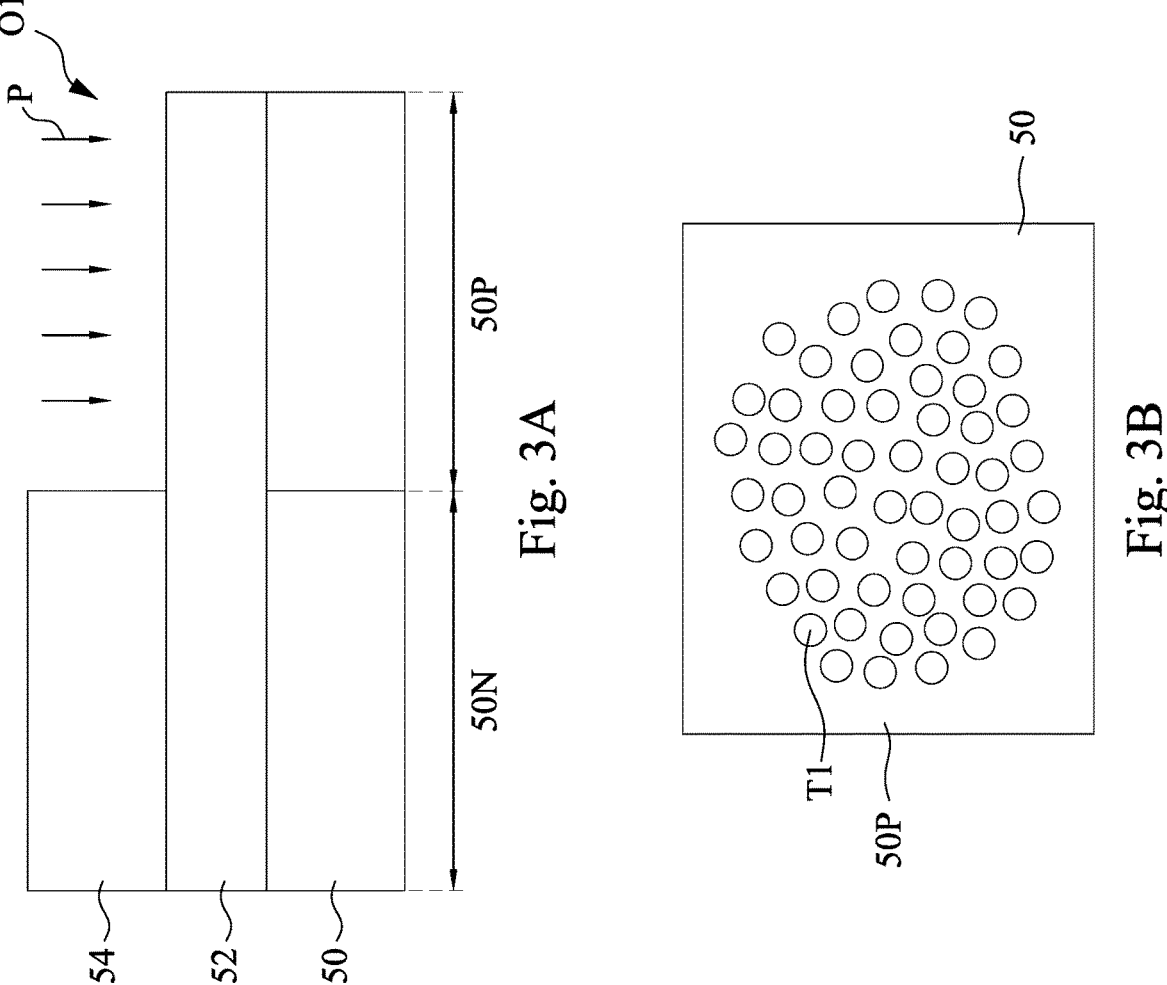
FIGS. 3A, 4A, 5A, 6, 7A, 7B, 8, 9, 10, 11A, 11B, 12A, 12B, 13A, 13B, 14A, 14B, 15A, 15B, 16A, and 16B illustrate a method in various stages of forming a semiconductor device in accordance with some embodiments of the present disclosure.
FIGS. 3B and 4B illustrate schematic plan-view transmission electron microscopy (PVTEM) images showing extended defect evolutions on a substrate after well implantation processes and prior to an annealing process in accordance with some embodiments of the present disclosure.

The method M begins at block S101. Referring to FIG. 3A, in some embodiments of block S101, a substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient sub-strate may also be used. In some embodiments, the semi-conductor material of the substrate 50 may include silicon; germanium; a compound semiconductor including silicon carbide, gallium arsenide, gallium phosphide, indium phos-phide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; com-binations thereof; or the like.

Referring back to FIG. 2A, the method M then proceeds to block S102 where a dielectric layer is formed over the substrate. With reference to FIG. 3A, a dielectric layer 52 may be formed over the substrate 50. The dielectric layer 52 may comprise a dielectric material, such as, silicon oxide ($SiO_2$), or the like. The dielectric layer 52 may be deposited or thermally grown according to acceptable techniques. In some embodiments, the dielectric layer 52 can have a thickness in a range from about 2 nm to about 8 nm, such as about 2, 3, 4, 5, 6, 7, or 8 nm. In accordance with some embodiments, the dielectric layer 52 can protect the top surface of the substrate 50 from contamination, prevent excessive damage to the substrate 52 during ion implanta-tion, and can control the depth of dopants during ion implantation.

Referring back to FIG. 2A, the method M then proceeds to block S103 where a first conductive type region is formed in the substrate. With reference to FIGS. 3A and 3B, in some embodiments of block S103, the substrate 50 may have an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (not separately illustrated), and any number of device features (e.g., other active devices, doped regions, isolation struc-tures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type impurity. A first well implantation process P1 may be performed on an upper portion of the substrate 50 to form an implantation region. This is described in greater detail with reference to FIG. 3A, a photoresist layer 54 may be formed over the dielectric layer 52. In accordance with some embodiments, the photoresist layer 54 can be patterned so that an opening O1 may be formed over the p-type region 50P. Subsequently, the first well implantation P1 can be performed through the opening O1 to dope a p-type dopant in the substrate 50 such that the p-type region 50P may be formed in the substrate 50. In some embodiments, p-type region 50P is substantially aligned to the opening O1 because the photoresist layer 54 can act as an implant mask. In some embodiments, the p-type dopant may include boron (B), or the like. In some embodiments, the first well implan-tation P1 may have an implanting energy in a range from about 5 keV to 50 keV. In some embodiments, the first well implantation P1 may have a total dose in a range from about 1E14 to 5E14 atoms/cm$^2$. In some embodiments, p-type region 50P can have a dopant concentration that is in a range from about $5×10^{16}$ atoms/cm$^3$ to about $1×10^{19}$ atoms/cm$^3$. The implantation region may extend under the source/drain regions in the nano-FETs that will be subsequently formed over the substrate 50. The implantation region may be used to reduce the leakage from the source/drain regions to the substrate 50. After the formation of p-type region 50P, the photoresist layer 54 can be removed with a wet clean process, an ashing process, or the like.

Figure 5A:
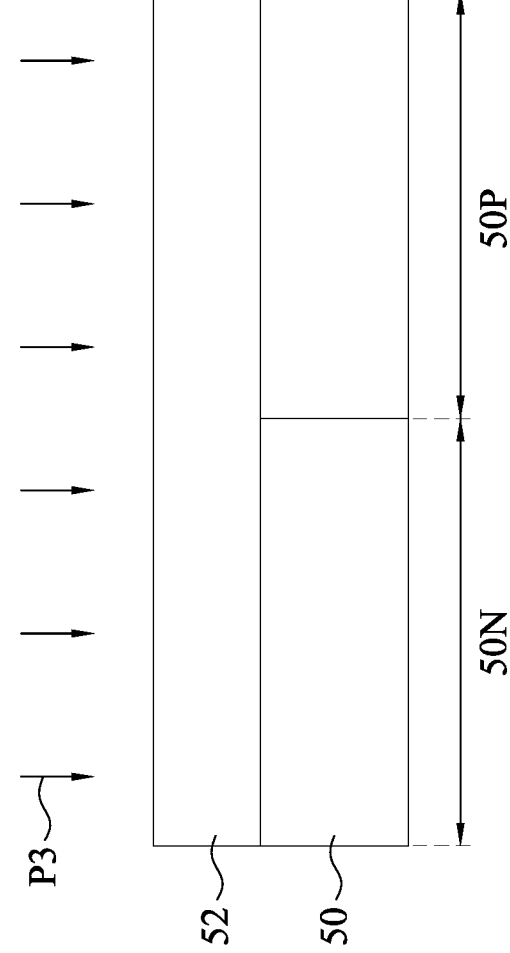
Figure 5B:
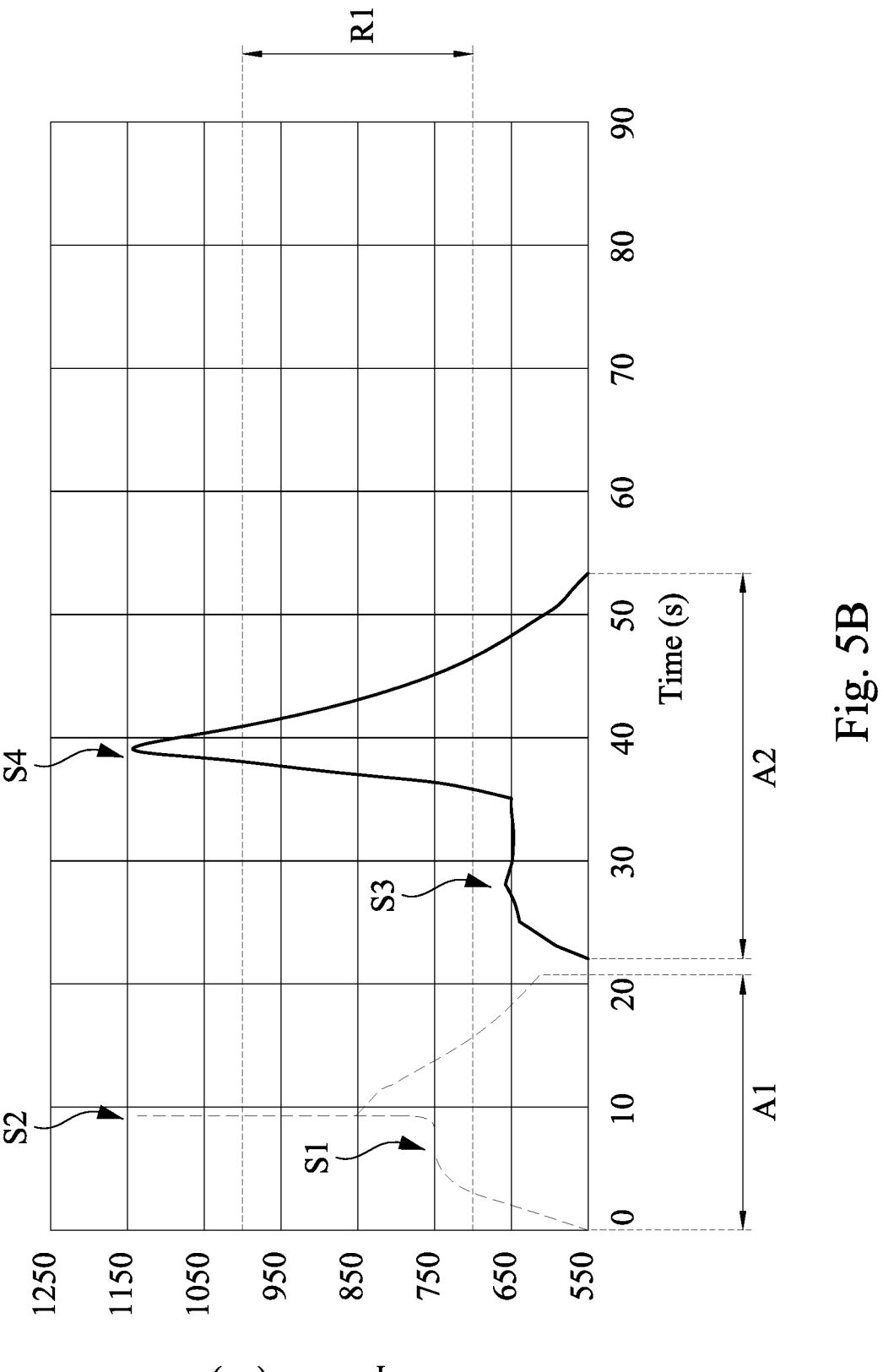
FIGS. 5B and 5C illustrate schematic temperature-time profiles of annealing processes in accordance with some embodiments of the present disclosure.
Figure 5C:
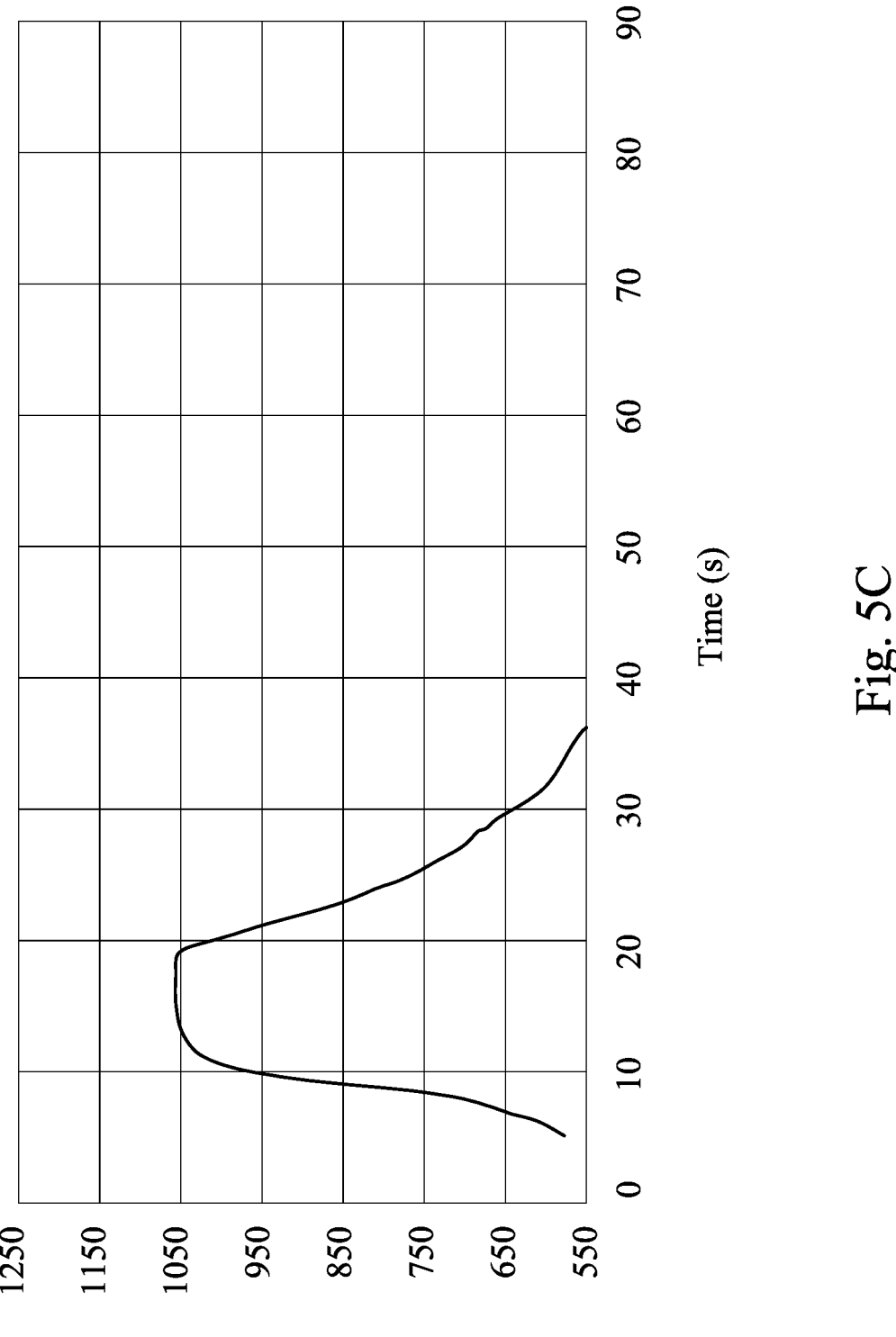
Figures 5D, 5E:
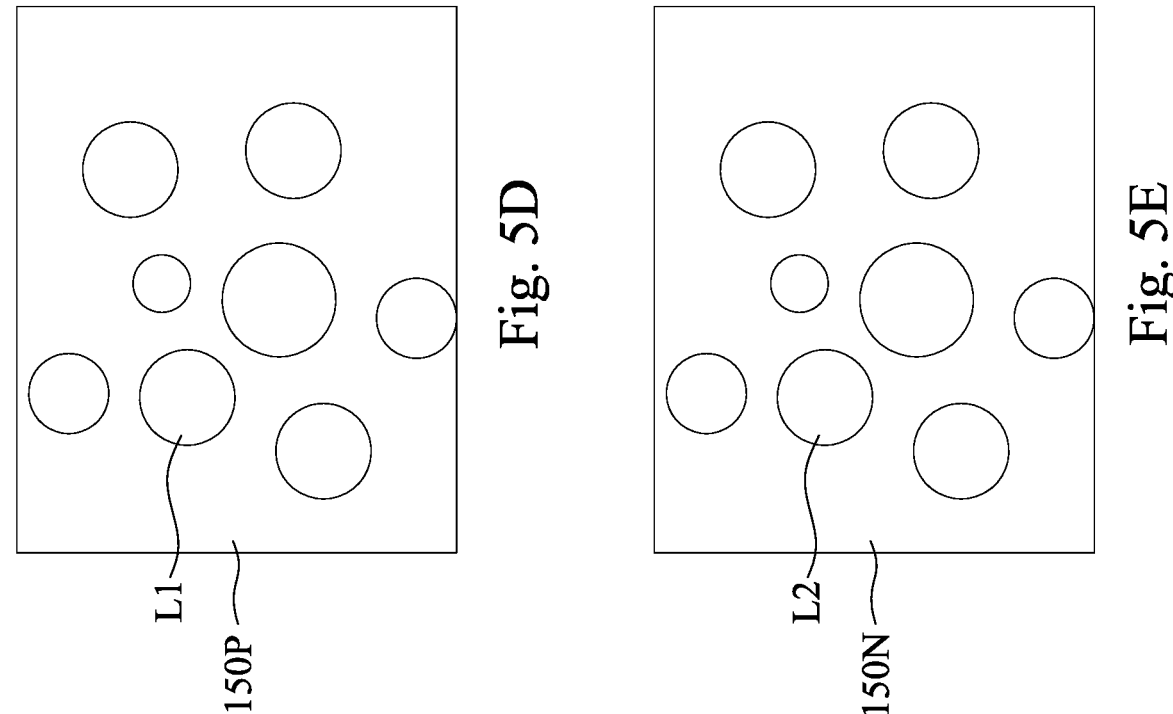
FIGS. 5D and 5E illustrate schematic PVTEM images showing extended defect evolutions on substrates after annealing processes in accordance with some embodiments of the present disclosure.

In some embodiments, silicon interstitial defects may be formed during the first well implantation process P1. FIG. 3B illustrates a schematic plan-view transmission electron microscopy (PVTEM) image showing the p-type region 50P of the substrate 50 having silicon interstitial defects T1 after the first well implantation process P1 and prior to an annealing processes in accordance with some embodiments of the present disclosure. In order to activate the dopants in wells on the p-type region 50P of the substrate 50 (e.g., move the dopants from interstitial sites to silicon lattice sites on the p-type region 50P), an annealing process may be performed on the p-type region 50P. However, if the anneal-ing temperature stays in a mid-temperature regime (e.g., temperature about 700-1000° C.) for longer than about 10 seconds, silicon interstitial defects T1 will cluster and form dislocation loops on the p-type region 50P. FIG. 5D illus-trates a PVTEM image showing a p-type region 150P of a semiconductor substrate having the dislocation loops L1 after the annealing process performed thereon in accordance with some embodiments of the present disclosure. The dislocation loops L1 on the p-type region 150P are difficult to be repaired even if the anneal temperature is raised to higher than about 1000° C. The dislocation loops L1 will result in defective well regions, which in turn lead to defective epitaxy structures subsequently formed on the well regions.

Figures 4A, 4B:
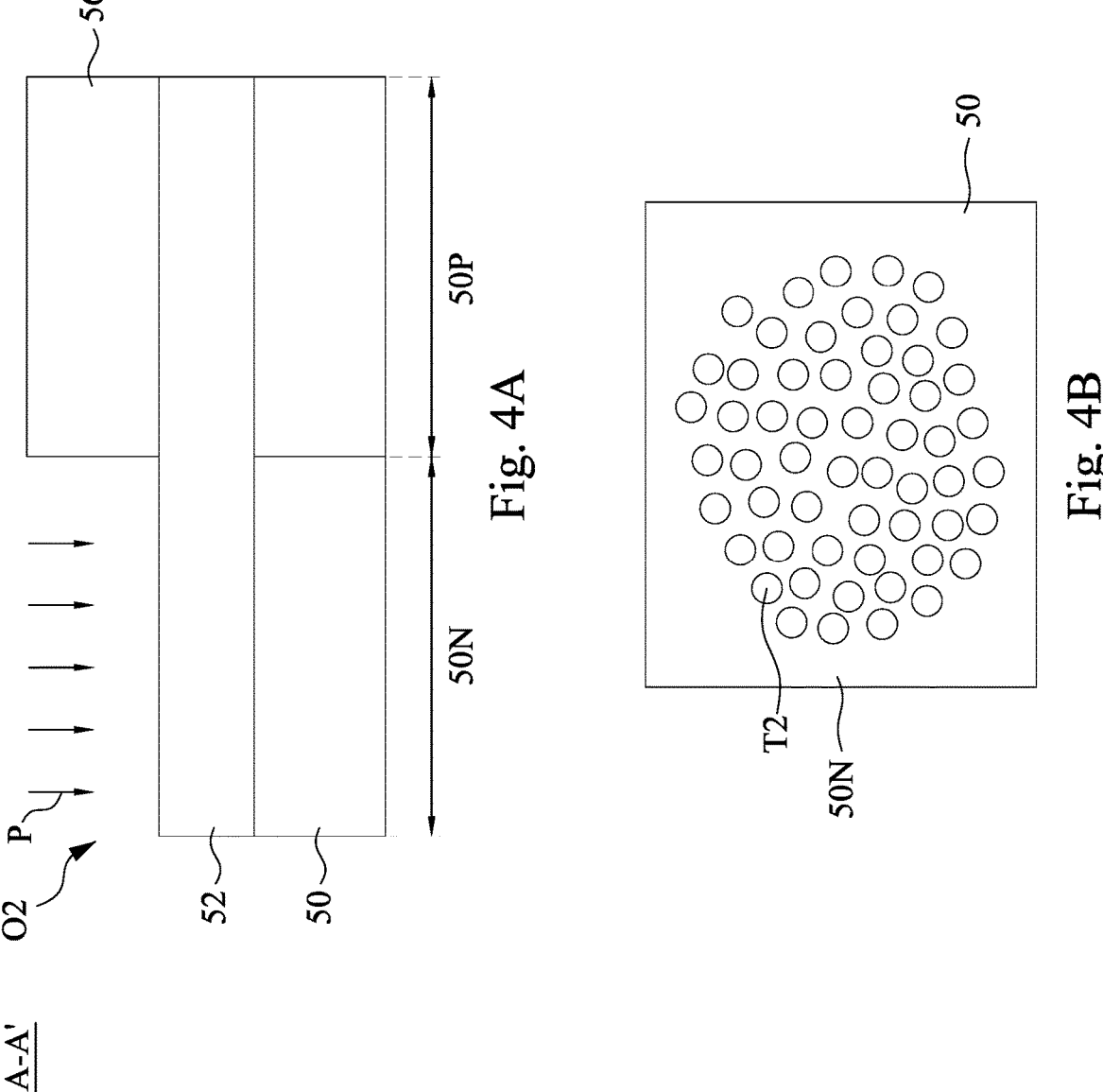

Referring back to FIG. 2A, the method M then proceeds to block S104 where a second conductive type region has an opposite conductive type to the first conductive type region is formed in the substrate. With reference to FIG. 4A, in some embodiments of block S104, the substrate 50 may be lightly doped with an n-type impurity. A second well implan-tation process P2 may be performed on an upper portion of the substrate 50 to form an implantation region. This is described in greater detail with reference to FIG. 4A, a photoresist layer 56 may be formed over the dielectric layer 52. In accordance with some embodiments, the photoresist layer 56 can be patterned so that an opening O2 may be formed over the n-type region 50N. Subsequently, the sec-ond well implantation P2 can be performed through the opening O2 to dope a n-type dopant in the substrate 50 such that the p-type region 50N may be formed in the substrate 50. In some embodiments, n-type region 50N is substantially aligned to the opening O2 because the photoresist layer 56 can act as an implant mask. In some embodiments, the n-type dopant may include arsenic (As), antimony (Sb), phosphorous (P), or the like. In some embodiments, the second well implantation P2 may have an implanting energy in a range from about 10 keV to 120 keV. In some embodi-ments, the second well implantation P2 may have a total dose in a range from about 1E14 to 5E14 atoms/cm$^2$. In some embodiments, the n-type region 50N can have a dopant concentration that is in a range from about $5×10^{16}$ atoms/cm$^3$ to about $1×10^{19}$ atoms/cm$^3$. The implantation region may extend under the source/drain regions in the nano-FETs that will be subsequently formed over the sub-strate 50. The implantation region may be used to reduce the leakage from the source/drain regions to the substrate 50.

After the formation of n-type region 50N, the photoresist layer 56 can be removed with a wet clean process, an ashing process, or the like.

In some embodiments, silicon interstitial defects may be formed during the second well implantation process P2. FIG. 4B illustrates a schematic PVTEM image showing the n-type region 50N of the substrate 50 having silicon interstitial defects T2 after the second well implantation process P2 and prior to an annealing processes in accordance with some embodiments of the present disclosure. In order to activate the dopants in wells on the n-type region 50N of the substrate 50, an annealing process may be performed on the n-type region 50N. However, if the annealing temperature stays in a mid-temperature regime (e.g., temperature about 700-1000° C.) for longer than about 10 seconds, silicon interstitial defects T2 will cluster and form dislocation loops on the n-type region 50N. FIG. 5E illustrates a PVTEM image showing a n-type region 150N of a semiconductor substrate having the dislocation loops L2 after the annealing processes performed thereon in accordance with some embodiments of the present disclosure. The dislocation loops L2 on the n-type region 150N are difficult to be repaired even if the anneal temperature is raised to higher than about 1000° C. The dislocation loops L2 will result in defective well regions, which in turn lead to defective epitaxy structures subsequently formed on the well regions.

Therefore, referring back to FIG. 2A, the method M then proceeds to block S105 where an annealing process including a flash anneal first followed by a RTA can be performed on the substrate, in which the flash anneal is mainly performed to suppress or reduce silicon interstitial clustering and the RTA is mainly performed to activate the dopants in the first and second conductive type regions. With reference to FIGS. 5A and 5B, in some embodiments of block S105, an annealing process P3 (see FIG. 5A) including a flash anneal (micro-second annealing, ussA) A1 (see FIG. 5B) first followed by a RTA A2 (see FIG. 5B). In some embodiments, the RTA A2 can be interchangeably referred to a spike anneal. The flash anneal A1 is mainly performed to repair silicon interstitial defects and the RTA A2 is mainly performed to activate the dopants in the p-type region 50P and the n-type region 50N after the silicon interstitial defects are eliminated by the flash anneal A1. The flash anneal A1 used to remove silicon interstitial defects quickly heats up to a defect removal temperature without being in a temperature range R1 (see FIG. 5B), such as a temperature range about 700-1000° C. for longer than about 10 seconds, to avoid clustering of the silicon interstitial defects, which in turn allows for suppressing the dislocation loop formation.

This is described in greater detail with reference to FIG. 5B, the flash anneal A1 of the annealing process P3 which can be performed to repair silicon interstitial defects may include a preheat step S1 and a annealing step S2 following the preheat step S1. The preheat step S1 is used to preheat the substrate 50. The annealing step S2 following the preheat step S1 is used to quickly heat up the substrate 50 to a defect removal temperature. A temperature ramp-up rate of the preaheat step S1 is lower than the temperature ramp-up rate of the annealing step S2. In some embodiments, the preheat step S1 may have a temperature range R1, such as between about 700° C. and 1000° C., for a time duration less than about 10 seconds (e.g., 1, 2, 3, 4, 5, 6, 7, 8, 9, or 10 seconds). Therefore, the method to perform with a shortened time duration in a mid-temperature regime (about 700-1000° C.) can suppress silicon interstitial defects to cluster, which in turn allows for suppressing the dislocation loop formation and reducing an area density of dislocation loops. In some embodiments, the preheat step S1 may have a temperature range R1 which is less than about 750° C. (e.g. 700° C.) to avoid clustering of the silicon interstitial defects. In some embodiments, the preheat step S1 does not have temperature within the temperature range R1, such as between about 700° C. and 1000° C., to avoid clustering of the silicon interstitial defects.

In some embodiments, the flash anneal A1 of the annealing process P3 can be performed on the substrate 50 at a temperature higher than about 1000° C., such that the silicon interstitial defects formed on the p-type region 50P and the n-type region 50N as shown in FIGS. 3B and 4B are repaired without forming of the dislocation loop and can be dissolved and recombined with vacancy, which in turn prevents defective epitaxy structures that are formed on the p-type region 50P and the n-type region 50N subsequently. In some embodiments, after the flash anneal A1 of the annealing process P3 performed on the substrate 50 is complete, the p-type region 50P and the n-type region 50N may be defect-free.

Referring to FIG. 5B, the preheat step S1 of the flash anneal A1 may have a temperature range between about 200 and 800° C. and a temperature ramp-up rate ranging from about 10 to 150° C./s, by way of example but not limiting the present disclosure. In some embodiments, the annealing step S2 of the flash anneal A1 may have a peak temperature ramp profile having a temperature range between about 1000 and 1200° C. For example, the preheat step S1 of the flash anneal A1 may have a temperature in a range from about 200 to 800° C. (e.g., about 200, 300, 400, 500, 600, 700, or 800° C.) and a temperature ramp-up rate ranging from about 10 to 150° C./s (e.g., about 10, 20, 30, 40, 50, 60, 70, 80, 90, 100, 110, 120, 130, 140, or 150° C./s) in a process time duration. The peak temperature ramp profile of the annealing step S2 of the flash anneal A1 may have a temperature in a range from about 1000 to 1200° C. (e.g., 1000, 1050, 1100, 1150, or 1200° C.) in a process time duration. In some embodiments, a half maximum full width of the peak temperature ramp profile of the annealing step S2 may be in a range from about 1 to 3 milliseconds (ms), such as about 1, 1.5, 2, 2.5, or 3 ms.

Referring to FIG. 5B, after the flash anneal A1 is complete, the RTA A2 can be performed to activate the dopants in the p-type region 50P and the n-type region 50N. The RTA A2 of the annealing process P3 may include preheat step S3 and an annealing step S4 following the preheat step S3. The preheat step S3 is used to preheat the substrate 50. The annealing step S4 following the preheat step S3 can be performed to activate the dopants in the p-type region 50P and the n-type region 50N. A temperature ramp-up rate of the preaheat step S3 is lower than the temperature ramp-up rate of the annealing step S4. The annealing step S4 of the RTA A2 may have a spike temperature ramp profile having a temperature range, such as between about 1000° C. and 1200° C., for a time duration in a range from about 1 to 500 seconds (e.g., about 1, 50, 100, 150, 200, 250, 300, 350, 400, 450, or 500 seconds). For example, the temperature range of the spike temperature ramp profile of the annealing step S4 may be in a range from about 1000 to 1200° C. (e.g., about 1000, 1050, 1100, 1150, or 1200° C.) in a process time duration. In some embodiments, the RTA A2 can be performed to further recover the remaining silicon interstitial defects and increase dopant activation level. In some embodiments, the preheat step S1 of the flash anneal A1 may be performed for a shorter duration than the preheat step S3 of the RTA A2.

Figure 5F:
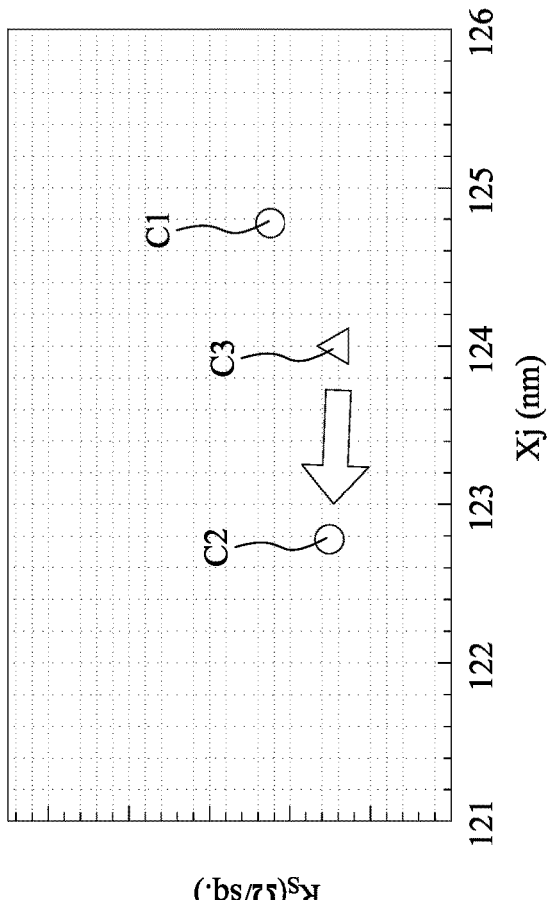
FIG. 5F illustrates experimental results showing different annealing conditions on a substrate effect on activation (Rs) versus junction depth (Xj) of dopants in the substrate in accordance with some embodiments of the present disclosure.
Figure 5G:
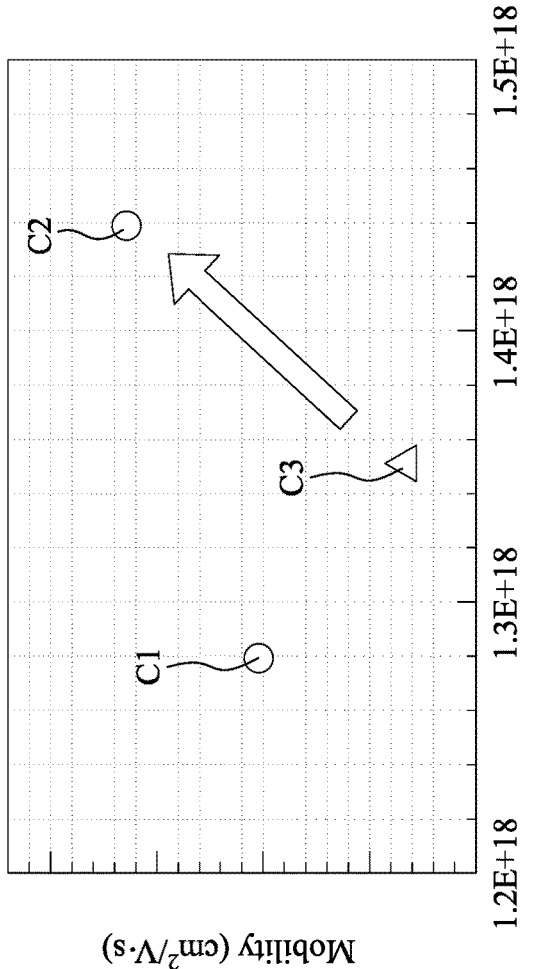
FIG. 5G illustrates experimental results showing different annealing conditions on a substrate effect on concentration (atom/cm$^3$) versus mobility (cm$^2$/Vs) of dopants in the substrate in accordance with some embodiments of the present disclosure.

Reference is made to FIGS. 5F and 5G. FIG. 5F illustrates experimental results showing different annealing conditions C1, C2, and C3 on substrates effect on activation (Rs) versus junction depth (Xj) of dopants in the substrates in accordance with some embodiments of the present disclosure. FIG. 5G illustrates experimental results showing the annealing conditions C1, C2, and C3 on the substrates effect on dopant concentration (atom/cm$^3$) versus mobility (cm$^2$/Vs) of dopants in the substrates in accordance with some embodiments of the present disclosure. In some embodiments, the annealing condition C1 is of a soak anneal having a temperature-time profile as shown in FIG. 5C and continuously ramp from about 700 to 1050° C. in about 10 seconds. In some embodiments, the annealing condition C2 is of a flash anneal first and followed a RTA as shown in FIG. 5B. In some embodiments, the annealing condition C3 is a RTA as shown in FIG. 5C.

The thermal budgets, may be defined as time integrals of the temperatures, are different on the annealing conditions C1, C2, and C3 and provide different impacts on diffusions. The temperature-time profiles would have to be weighted with the temperature-dependent dopant diffusivity. Locally, dopant diffusion may be reduced by clustering and precipitation while implant damage (e.g. dislocation loop formations) may lead to increased diffusivities. In some embodiments, the flash anneal may have a less thermal budget than the soak anneal and the RTA. In some embodiments, the annealing condition C2 has much less thermal budget in mid-temperature regime (about 700-1000° C.) than the annealing condition C1, which can suppress silicon interstitial clustering and in turn allows for reducing an area density of dislocation loops. In some embodiments, the annealing condition C2 can reduce about 1 order in nanosheet concave defect compared to the soak anneal. Therefore, the flash anneal first followed by the RTA can eliminate silicon interstitial defect and suppress transient enhanced diffusion during the annealing process.

By way of example but not limiting the present disclosure, due to the soak anneal on dopants the substrate, a dopant diffusion length may be in a range from about 350 nm to about 400 nm, such as about 350, 375, or 400 nm. Due to the flash anneal A1 of the annealing process P3 on dopants in the substrate, a dopant diffusion length may be in a range from about 13 nm to about 20 nm, such as about 13, 14, 15, 16, 16.6, 17, 18, 19, or 20 nm, due to the flash anneal A1 of the annealing process P3. Due to the flash anneal A1 of the annealing process P3 on dopants in the substrate, a dopant diffusion length may be in a range from about 50 nm to about 90 nm, such as about 50, 55, 60, 65, 69.1, 70, 75, 80, 85, or 90 nm. Therefore, the dopant diffusion length of annealing condition C2 is less than the dopant diffusion length of annealing condition C1. After annealing condition C2 including the flash anneal first and followed RTA is performed, the activation, junction depth, concentration, and mobility of the dopants can be improved, which in turn allows for improving the performance of the semiconductor device.

As shown in FIG. 5F, after the annealing process on the substrates, the activations of the annealing conditions C2 and C3 are less than that of the annealing conditions C1, and the junction depth of the annealing condition C2 is less than those of the annealing conditions C1 and C3. For example, the post RTA after the flash anneal can improve the dopant activation to increase the activated dose, such as an increase of 7%, compared to the soak anneal. As shown in FIG. 5G, after the annealing process on the substrates, the dopant concentration of the annealing condition C2 are greater than those of the annealing conditions C1 and C3, and the mobility of the annealing condition C2 is greater than those of the annealing conditions C1 and C3. For example, the post RTA after the flash anneal process can recover the remaining defects to increase the mobility, such as an increase of 26%, compared to the soak anneal. Therefore, the flash anneal first followed by the RTA can reduce activation (Rs) and improve Hall carrier concentration, which in turn allows for improving the performance of the semiconductor device.

In some embodiments, the annealing process P3 may be carried out in nitrogen (e.g., about 100 ppm oxygen) and/or in an oxygen-containing ambient (e.g., about 10% O$_2$) on dopant diffusion and activation. In some embodiments, the annealing process P3 can be performed in an annealing furnace or in a rapid thermal anneal (RTA) chamber.

Referring back to FIG. 2A, the method M then proceeds to block S106 where the dielectric layer is removed. With reference to FIG. 6, in some embodiments of block S106, the dielectric layer may be removed by an etching process including, such as dry etching, wet etching, such as dilute HF, and/or other etching methods (e.g., reactive ion etching).

Referring back to FIG. 2A, the method M then proceeds to block S107 where a multi-layer stack is formed over the substrate. With reference to FIG. 7A, in some embodiments of block S107, a multi-layer stack 42 is formed over the substrate 50. The multi-layer stack 42 includes alternating first semiconductor layers 44 and second semiconductor layers 46. The first semiconductor layers 44 are formed of a first semiconductor material, and the second semiconductor layers 46 are formed of a second semiconductor material. The semiconductor materials may each be selected from the candidate semiconductor materials of the substrate 50. In some embodiments, the multi-layer stack 42 includes three layers of each of the first semiconductor layers 44 and the second semiconductor layers 46. It should be appreciated that the multi-layer stack 42 may include any number of the first semiconductor layers 44 and the second semiconductor layers 46.

In some embodiments, and as will be subsequently described in greater detail, the first semiconductor layers 44 will be removed and the second semiconductor layers 46 will patterned to form channel regions for the nano-FETs in both the n-type region 50N and the p-type region 50P. The first semiconductor layers 44 are sacrificial layers (or dummy layers), which will be removed in subsequent processing to expose the top surfaces and the bottom surfaces of the second semiconductor layers 46. The first semiconductor material of the first semiconductor layers 44 is a material that has a high etching selectivity from the etching of the second semiconductor layers 46, such as silicon germanium. The second semiconductor material of the second semiconductor layers 46 is a material suitable for both n-type and p-type devices, such as silicon.

In some embodiments, the first semiconductor layers 44 will be patterned to form channel regions for nano-FETs in one region (e.g., the p-type region 50P), and the second semiconductor layers 46 will be patterned to form channel regions for nano-FETs in another region (e.g., the n-type region 50N). The first semiconductor material of the first semiconductor layers 44 may be a material suitable for p-type devices, such as silicon germanium (e.g., Si$_x$Ge$_{1-x}$, where x can be in the range of 0 to 1), pure germanium, a III-V compound semiconductor, a II-VI compound semiconductor, or the like. The second semiconductor material of the second semiconductor layers 46 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another.

Each of the layers of the multi-layer stack 42 may be grown by a process such as vapor phase epitaxy (VPE) or molecular beam epitaxy (MBE), deposited by a process such as chemical vapor deposition (CVD) or atomic layer deposition (ALD), or the like. In some embodiments, the multi-layer stack 42 may have a thickness in a range from about 70 to 120 nm, such as about 70, 80, 90, 100, 110, or 120 nm. In some embodiments, each of the layers may have a small thickness, such as a thickness in a range of about 5 nm to about 40 nm. In some embodiments, some layers (e.g., the second semiconductor layers 46) are formed to be thinner than other layers (e.g., the first semiconductor layers 44). For example, in embodiments in which the first semiconductor layers 44 are sacrificial layers (or dummy layers) and the second semiconductor layers 46 are patterned to form channel regions for the nano-FETs in both the n-type region 50N and the p-type region 50P.

Figure 7B:
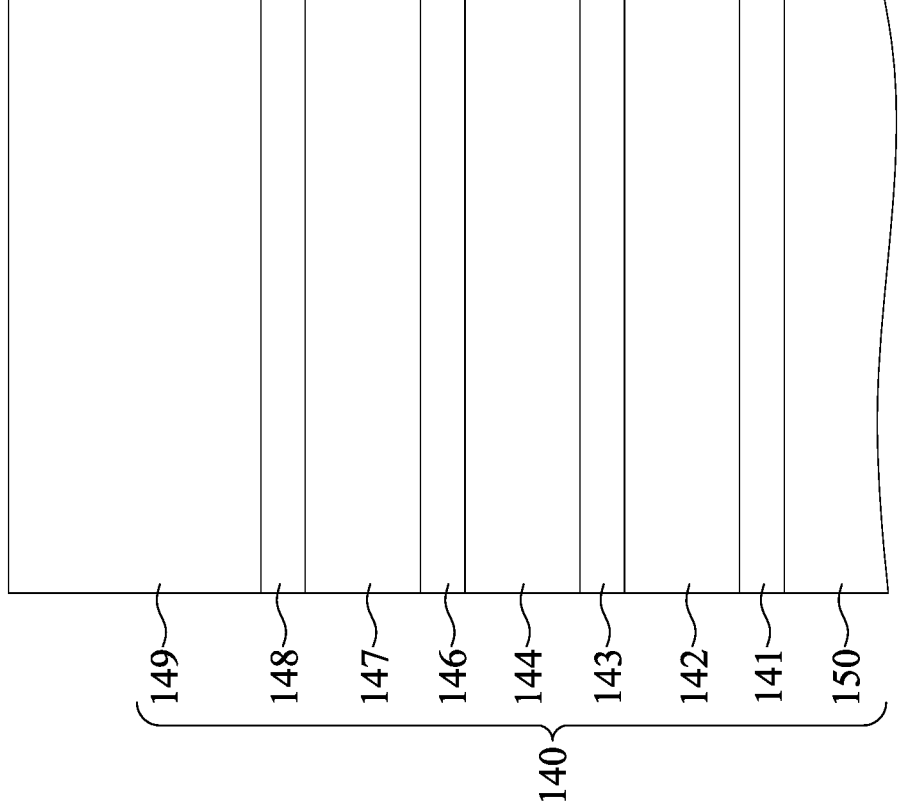

Reference is made to FIG. 7B. FIG. 7B illustrates another wafer at a stage corresponding to FIG. 7A according to some alternative embodiments of the present disclosure to illustrate different profiles. In some embodiments, material and manufacturing method of a substrate 150, a n-type region 150N, a p-type region 150P, first semiconductor layers 141, 142, 143, 144, and second semiconductor layers 146, 147, 148, 149 included in the structure shown in FIG. 7B are substantially the same as those of the substrate 50, the n-type region 50N, the p-type region 50P, and the first and second semiconductor layers 44 and 46 as shown in FIG. 7A, and the related detailed descriptions may refer to the foregoing paragraphs, and are not described again herein.

In FIG. 7B, a multi-layer stack 140 is formed over the substrate 150. The multi-layer stack 140 includes alternating first semiconductor layers 141, 142, 143, 144 and second semiconductor layers 146, 147, 148, 149 In some embodiments, the first semiconductor layers 141, 142, 143, 144 may be formed of, such as silicon germanium, and the second semiconductor layers 146, 147, 148, 149 may be of, such as silicon. In some embodiments, the first semiconductor layers 141, 142, 143, 144 have an atomic ratio of germanium to silicon substantially in a range from about 20% to about 25%, such as about 20, 21, 22, 23, 24, or 25%, such that the first semiconductor material and the second semiconductor material may have a high etching selectivity from the etching of one another. In some embodiments, the multi-layer stack 140 includes four layers of each of the first semiconductor layers and the second semiconductor layers. It should be appreciated that the multi-layer stack 140 may include any number of the first semiconductor layers and the second semiconductor layers.

In some embodiments, the second semiconductor layers 146, 147, 148, 149 are formed to be thicker than the first semiconductor layers 141, 142, 143, 144. In some embodiments, the topmost second semiconductor layer 149 has a thicker thickness than the others second semiconductor layer 146, 147, 148. In some embodiments, the topmost first semiconductor layer 144 has a thinner thickness than the others first semiconductor layer 141, 142, 143. Each of the layers may have a small thickness, such as a thickness in a range of about 5 nm to about 40 nm. By way of example but not limiting the present disclosure, the first semiconductor layers 141, 142, 143, 144 may have thicknesses about 6.5, 6.5, 6.5, 4 nm, respectively, and the second semiconductor layers 146, 147, 148, 149 may have thicknesses about 9.5, 9.5, 11, 40 nm, respectively.

Referring back to FIG. 2A, the method M then proceeds to block S108 where trenches are patterned in the substrate and the multi-layer stack to form fins and first and second nanostructures. With reference to FIG. 8, in some embodiments of block S108, trenches are patterned in the substrate 50 and the multi-layer stack 42 to form fins 62, first nanostructures 64, and second nanostructures 66. The fins 62 are semiconductor strips patterned in the substrate 50. The first nanostructures 64 and the second nanostructures 66 include the remaining portions of the first semiconductor layers 44 and the second semiconductor layers 46, respectively. The trenches may be patterned by any acceptable etch process, such as a reactive ion etch (RIE), neutral beam etch (NBE), the like, or a combination thereof. The etching may be anisotropic.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the nanostructures 64, 66. In some embodiments, the mask (or other layer) may remain on the nanostructures 64, 66.

The fins 62 and the nanostructures 64, 66 may each have widths in a range of about 8 nm to about 40 nm. In some embodiments, the fins 62 and the nanostructures 64, 66 have substantially equal widths in the n-type region 50N and the p-type region 50P. In another embodiment, the fins 62 and the nanostructures 64, 66 in one region (e.g., the n-type region 50N) are wider or narrower than the fins 62 and the nanostructures 64, 66 in another region (e.g., the p-type region 50P).

Referring back to FIG. 2A, the method M then proceeds to block S109 where shallow trench isolation (STI) structures are formed over the substrate and between adjacent fins. With reference to FIG. 9, in some embodiments of block S109, STI structures 70 are formed over the substrate 50 and between adjacent fins 62. The STI structures 70 are disposed around at least a portion of the fins 62 such that at least a portion of the nanostructures 64, 66 protrude from between adjacent STI structures 70. In some embodiments, the top surfaces of the STI structures 70 are coplanar (within process variations) with the top surfaces of the fins 62. In some embodiments, the top surfaces of the STI structures 70 are above or below the top surfaces of the fins 62. The STI structures 70 separate the features of adjacent devices.

The STI structures 70 may be formed by any suitable method. For example, an insulation material can be formed over the substrate 50 and the nanostructures 64, 66, and between adjacent fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI structures 70 are each illustrated as a single layer, some embodiments may utilize multiple layers. For example, in some embodiments a liner (not separately illustrated) may first be formed along surfaces of the sub-strate 50, the fins 62, and the nanostructures 64, 66. There-after, a fill material, such as those previously described may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In embodiments in which a mask remains on the nanostructures 64, 66, the planarization process may expose the mask or remove the mask. After the planarization process, the top surfaces of the insulation material and the mask (if present) or the nanostructures 64, 66 are coplanar (within process variations). Accordingly, the top surfaces of the mask (if present) or the nanostructures 64, 66 are exposed through the insulation material. In some embodi-ments, no mask remains on the nanostructures 64, 66. The insulation material is then recessed to form the STI struc-tures 70. The insulation material is recessed such that at least a portion of the nanostructures 64, 66 protrude from between adjacent portions of the insulation material. Further, the top surfaces of the STI structures 70 may have a flat surface as illustrated, a convex surface, a concave surface (such as dishing), or a combination thereof. The top surfaces of the STI structures 70 may be formed flat, convex, and/or con-cave by an appropriate etch. The insulation material may be recessed using any acceptable etching process, such as one that is selective to the material of the insulation material (e.g., selectively etches the insulation material of the STI structures 70 at a faster rate than the materials of the fins 62 and the nanostructures 64, 66). For example, an oxide removal may be performed using dilute hydrofluoric (dHF) acid.

The process previously described is just one example of how the fins 62 and the nanostructures 64, 66 may be formed. In some embodiments, the fins 62 and/or the nano-structures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostruc-tures 64, 66. The epitaxial structures may include the alter-nating semiconductor materials previously described, such as the first semiconductor material and the second semicon-ductor material. In some embodiments where epitaxial struc-tures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the fins 62, and/or the substrate 50. The wells may have a conductivity type opposite from a conductivity type of source/drain regions that will be subsequently formed in each of the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using mask (not separately illustrated) such as a photoresist. For example, a photoresist may be formed over the fins 62, the nanostructures 64, 66, and the STI structures 70 in the n-type region 50N. The photoresist is patterned to expose the p-type region 50P. The photoresist can be formed by using a spin-on technique and can be patterned using acceptable photolithography tech-niques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, anti-mony, or the like implanted in the region to a concentration in the range of about $10^{13}$ cm$^{-3}$ to about $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the fins 62, the nanostructures 64, 66, and the STI structures 70 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the pho-toresist may act as a mask to substantially prevent p-type impurities from being implanted into the p-type region 50P. The p-type impurities may be boron, boron fluoride, indium, or the like implanted in the region to a concentration in the range of about $10^{13}$ cm$^{-3}$ to about $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 62 and/or the nanostructures 64, 66, the grown materials may be in situ doped during growth, which may obviate the implantations, although in situ and implantation doping may be used together.

Referring back to FIG. 2A, the method M then proceeds to block S110 where a dummy dielectric layer, a dummy gate layer, and a mask layer are sequentially formed on the fins and the first and second nanostructures. With reference to FIG. 9, in some embodiments of block S110, a dummy dielectric layer 72 is formed on the fins 62 and the nano-structures 64, 66. The dummy dielectric layer 72 may be formed of a dielectric material such as silicon oxide, silicon nitride, a combination thereof, or the like, which may be deposited or thermally grown according to acceptable tech-niques. Subsequently, a dummy gate layer 74 is formed over the dummy dielectric layer 72. Subsequently, a mask layer 76 is formed over the dummy gate layer 74. The dummy gate layer 74 may be deposited over the dummy dielectric layer 72 and then planarized, such as by a CMP. The mask layer 76 may be deposited over the dummy gate layer 74. The dummy gate layer 74 may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer 74 may be formed of material(s) that have a high etching selectivity from the etching of insulation materials, e.g., the STI structures 70 and/or the dummy dielectric layer 72. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In some embodiments, the dummy dielectric layer 72 covers the fins 62, the nanostructures 64, 66, and the STI structures 70, such that the dummy dielectric layer 72 extends over the STI structures 70 and between the dummy gate layer 74 and the STI structures 70. In another embodiment, the dummy dielectric layer 72 covers only the fins 62 and the nano-structures 64, 66.

Referring back to FIG. 2B, the method M then proceeds to block S111 where the mask layer is patterned to form masks, and the pattern of the masks is subsequently trans-ferred to the dummy gate layer to form dummy gates. With reference to FIG. 10, in some embodiments of block S111, the mask layer 76 is patterned using acceptable photolithog-raphy and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover portions of the nanostructures 64, 66 that will be exposed in subsequent processing to form channel regions. Specifically, the dummy gates 84 extend along the portions of the nanostructures 66 that will be patterned to form channel regions 68. The pattern of the masks 86 may be used to physically separate adjacent dummy gates 84. The dummy gates 84 may also have lengthwise directions substantially perpendicular (within process variations) to the lengthwise directions of the fins 62. The masks 86 can optionally be removed after pattern-ing, such as by any acceptable etching technique.

Figures 11A, 11B:
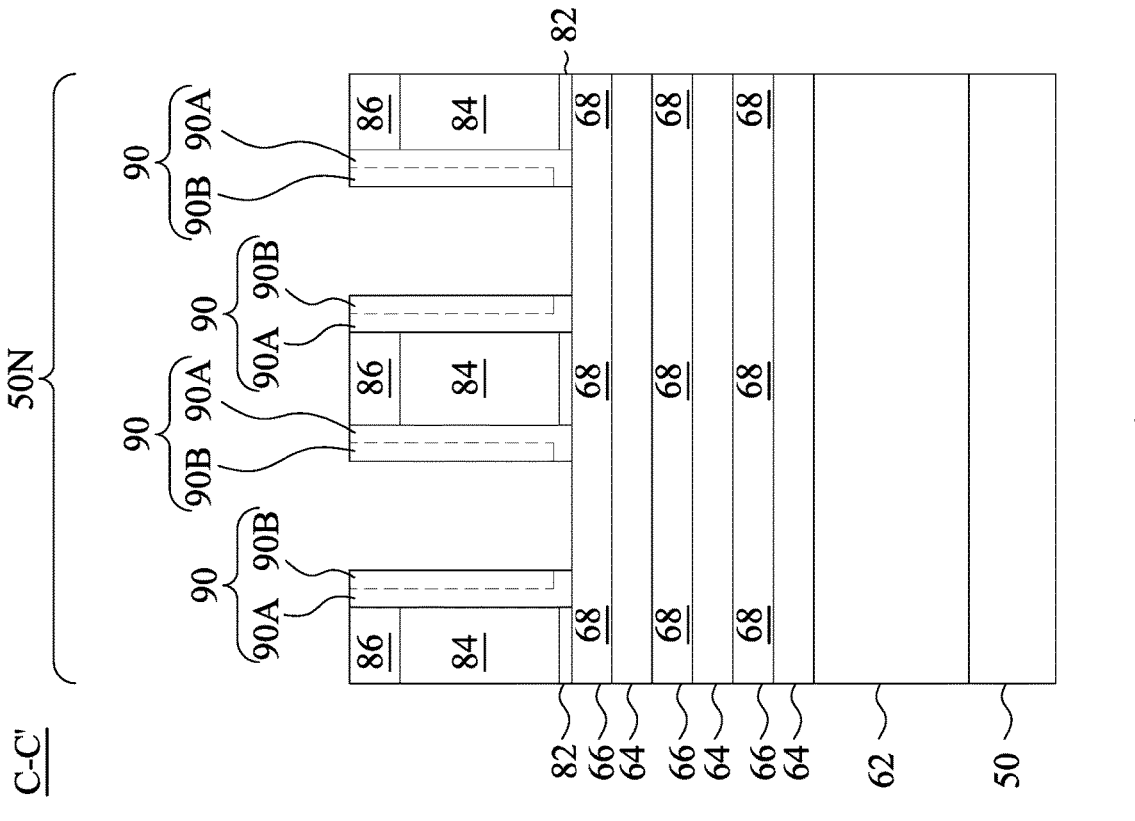

Referring back to FIG. 2B, the method M then proceeds to block S112 where gate spacers are formed over the first and second nanostructures, on exposed sidewalls of the masks, the dummy gates, and the dummy dielectrics. With reference to FIGS. 11A and 11B, in some embodiments of block S112, gate spacers 90 are formed over the nanostruc-tures 64, 66, on exposed sidewalls of the masks 86 (if present), the dummy gates 84, and the dummy dielectrics 82. The gate spacers 90 may be formed by conformally depos-iting one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemi-cal vapor deposition (PECVD), atomic layer deposition (ALD), plasma-enhanced atomic layer deposition (PEALD), or the like. Other insulation materials formed by any accept-able process may be used. In some embodiments, the gate spacers 90 each include multiple layers, e.g., a first spacer layer 90A and a second spacer layer 90B. In some embodi-ments, the first spacer layers 90A and the second spacer layers 90B are formed of silicon oxycarbonitride (e.g., $SiO_xN_yC_{1-x-y}$, where x and y are in the range of 0 to 1), with the first spacer layers 90A formed of a similar or a different composition of silicon oxycarbonitride than the second spacer layers 90B. Any acceptable etch process, such as a dry etch, a wet etch, the like, or a combination thereof, may be performed to pattern the dielectric material(s). The etch-ing may be anisotropic. The dielectric material(s), when etched, have portions left on the sidewalls of the dummy gates 84 (thus forming the gate spacers 90).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 62 and/or the nanostructures 64, 66 exposed in the p-type region 50P. The mask may then be removed. Subsequently, a mask (not separately illus-trated) such as a photoresist may be formed over the p-type region 50P while exposing the n-type region 50N, and appropriate type impurities (e.g., n-type) may be implanted into the fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 84, so that the channel regions 68 remain substantially free of the impurity implanted to form the LDD regions. The LDD regions may have a concentration of impurities in the range of about $10^{15}$ cm$^{-3}$ to about $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figures 12A, 12B:
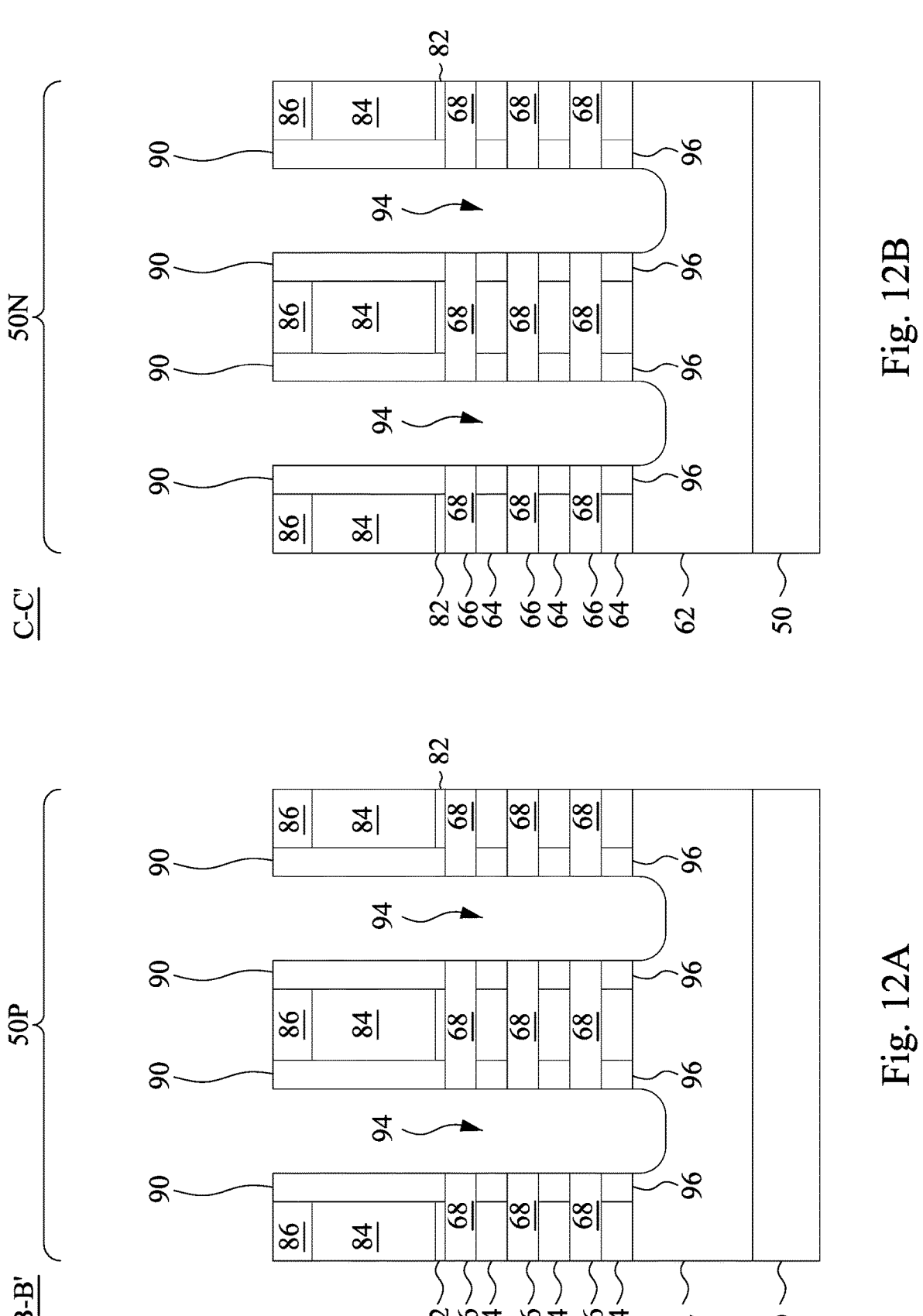

Referring back to FIG. 2B, the method M then proceeds to block S113 where source/drain recesses are formed in the first and second nanostructures. With reference to FIGS. 12A and 12B, in some embodiments of block S113, source/drain recesses 94 are formed in the nanostructures 64, 66. In some embodiments, the source/drain recesses 94 extend through the nanostructures 64, 66 and into the fins 62. The source/drain recesses 94 may also extend into the substrate 50. In various embodiments, the source/drain recesses 94 may extend to a top surface of the substrate 50 without etching the substrate 50; the fins 62 may be etched such that bottom surfaces of the source/drain recesses 94 are disposed below the top surfaces of the STI structures 70; or the like. The source/drain recesses 94 may be formed by etching the nanostructures 64, 66 using an anisotropic etching pro-cesses, such as a RIE, a NBE, or the like. The gate spacers 90 and the dummy gates 84 collectively mask portions of the fins 62 and/or the nanostructures 64, 66 during the etching processes used to form the source/drain recesses 94. A single etch process may be used to etch each of the nanostructures 64, 66, or multiple etch processes may be used to etch the nanostructures 64, 66. Timed etch processes may be used to stop the etching of the source/drain recesses 94 after the source/drain recesses 94 reach a desired depth.

Referring back to FIG. 2B, the method M then proceeds to block S114 where inner spacers are formed on sidewalls of the first nanostructures. With reference to FIGS. 12A and 12B, in some embodiments of block S114, inner spacers 96 are formed on sidewalls of the remaining portions of the first nanostructures 64, e.g., those sidewalls exposed by the source/drain recesses 94. As will be subsequently described in greater detail, source/drain regions will be subsequently formed in the source/drain recesses 94, and the first nanostructures 64 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etching processes, such as etching processes used to subsequently remove the first nanostructures 64.

As an example to form the inner spacers 96, the source/drain recesses 94 can be laterally expanded. Specifically, portions of the sidewalls of the first nanostructures 64 exposed by the source/drain recesses 94 may be recessed. Although sidewalls of the first nanostructures 64 are illustrated as being straight, the sidewalls may be concave or convex. The sidewalls may be recessed by any acceptable etching process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 94 and recess the sidewalls of the first nanostructures 64. The inner spacers 96 can then be formed by conformally forming an insulating material and subsequently etching the insulating material. The insulating material may be silicon nitride or silicon oxynitride, although any suitable material, such as low-dielectric constant (low-k) materials having a k-value less than about 3.5, may be utilized. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 96 are illustrated as being flush with respect to the sidewalls of the gate spacers 90, the outer sidewalls of the inner spacers 96 may extend beyond or be recessed from the sidewalls of the gate spacers 90. In other words, the inner spacers 96 may partially fill, completely fill, or overfill the sidewall recesses. Moreover, although the sidewalls of the inner spacers 96 are illustrated as being straight, the sidewalls of the inner spacers 96 may be concave or convex.

Figures 13A, 13B:
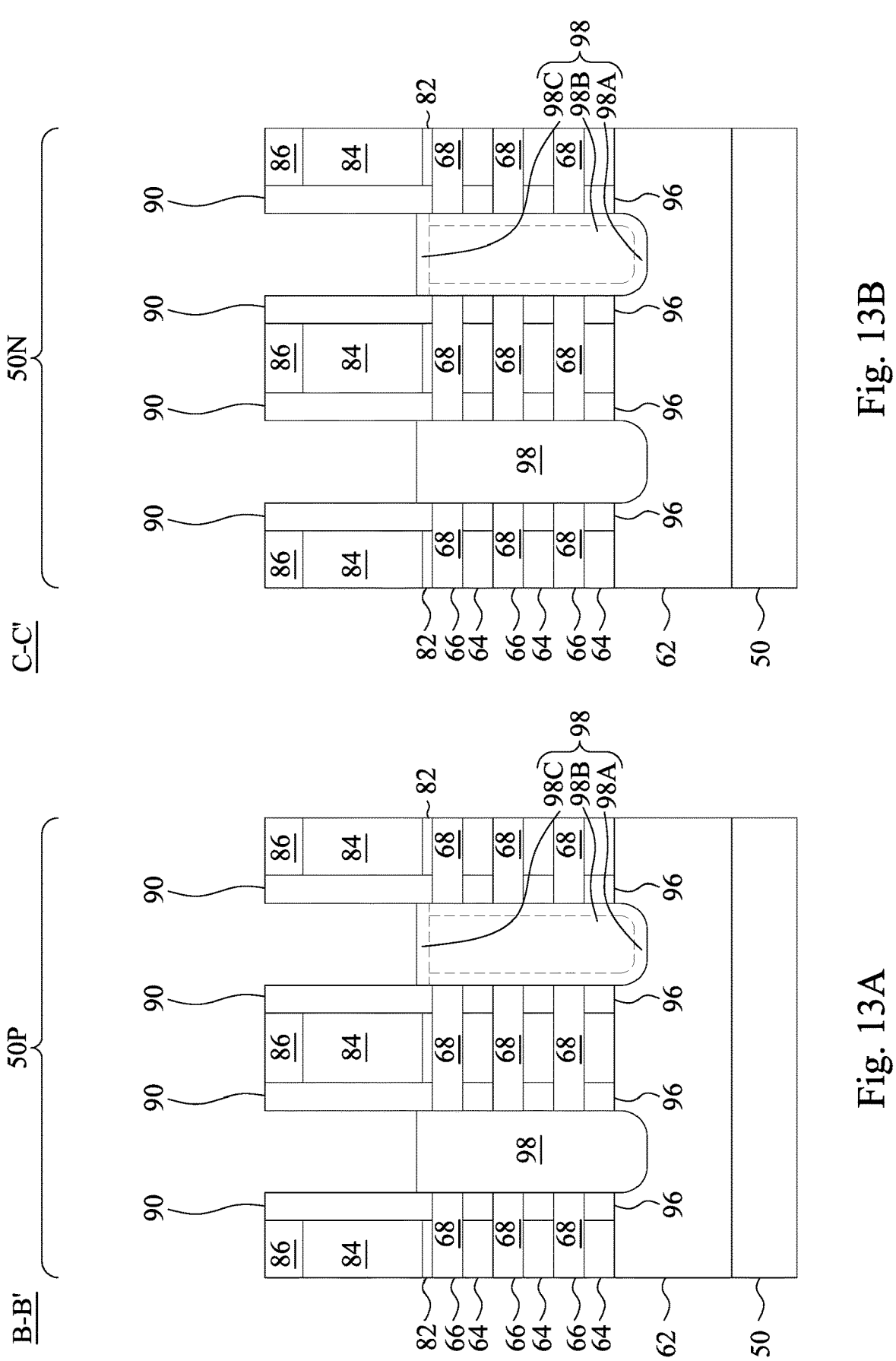

Referring back to FIG. 2B, the method M then proceeds to block S115 where epitaxial source/drain regions are formed in the source/drain recesses. With reference to FIGS. 13A and 13B, in some embodiments of block S115, epitaxial source/drain regions 98 are formed in the source/drain recesses 94. The epitaxial source/drain regions 98 are formed in the source/drain recesses 94 such that each dummy gate 84 (and corresponding channel regions 68) is disposed between respective adjacent pairs of the epitaxial source/drain regions 98. In some embodiments, the gate spacers 90 and the inner spacers 96 are used to separate the epitaxial source/drain regions 98 from, respectively, the dummy gates 84 and the first nanostructures 64 by an appropriate lateral distance so that the epitaxial source/drain regions 98 do not short out with subsequently formed gates of the resulting nano-FETs. A material of the epitaxial source/drain regions 98 may be selected to exert stress in the respective channel regions 68, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 94 in the n-type region 50N. The epitaxial source/drain regions 98 may include any acceptable material appropriate for n-type devices. For example, the epitaxial source/drain regions 98 in the n-type region 50N may include materials exerting a tensile strain on the channel regions 68, such as silicon, silicon carbide, phosphorous doped silicon carbide, silicon phosphide, or the like. The epitaxial source/drain regions 98 in the n-type region 50N may be referred to as "n-type source/drain regions." The epitaxial source/drain regions 98 in the n-type region 50N may have surfaces raised from respective surfaces of the fins 62 and the nanostructures 64, 66, and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 94 in the p-type region 50P. The epitaxial source/drain regions 98 may include any acceptable material appropriate for p-type devices. For example, the epitaxial source/drain regions 98 in the p-type region 50P may include materials exerting a compressive strain on the channel regions 68, such as silicon germanium, boron doped silicon germanium, germanium, germanium tin, or the like. The epitaxial source/drain regions 98 in the p-type region 50P may be referred to as "p-type source/drain regions." The epitaxial source/drain regions 98 in the p-type region 50P may have surfaces raised from respective surfaces of the fins 62 and the nanostructures 64, 66, and may have facets.

The epitaxial source/drain regions 98, the nanostructures 64, 66, and/or the fins 62 may be implanted with impurities to form source/drain regions, similar to the process previously described for forming LDD regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously described. In some embodiments, the epitaxial source/drain regions 98 may be in situ doped during growth.

In some embodiments, the spacer etch used to form the gate spacers 90 is adjusted to also form fin spacers 92 on sidewalls of the fins 62 and/or the nanostructures 64, 66. The fin spacers 92 are formed to cover a portion of the sidewalls of the fins 62 and/or the nanostructures 64, 66 that extend above the STI structures 70, thereby blocking the epitaxial growth. In another embodiment, the spacer etch used to form the gate spacers 90 is adjusted to not form fin spacers, so as to allow the epitaxial source/drain regions 98 to extend to the surface of the STI structures 70.

The epitaxial source/drain regions 98 may include one or more semiconductor material layers. For example, the epitaxial source/drain regions 98 may each include a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. Each of the liner layer 98A, the main layer 98B, and the finishing layer 98C may be formed of different semiconductor materials and may be doped to different impurity concentrations. In some embodiments, the liner layer 98A may have a lesser concentration of impurities than the main layer 98B, and the finishing layer 98C may have a greater concentration of impurities than the liner layer 98A and a lesser concentration of impurities than the main layer 98B. In embodiments in which the epitaxial source/drain regions 98 include three semiconductor material layers, the liner layers 98A may be grown in the source/drain recesses 94, the main layers 98B may be grown on the liner layers 98A, and the finishing layers 98C may be grown on the main layers 98B.

Figures 14A, 14B:
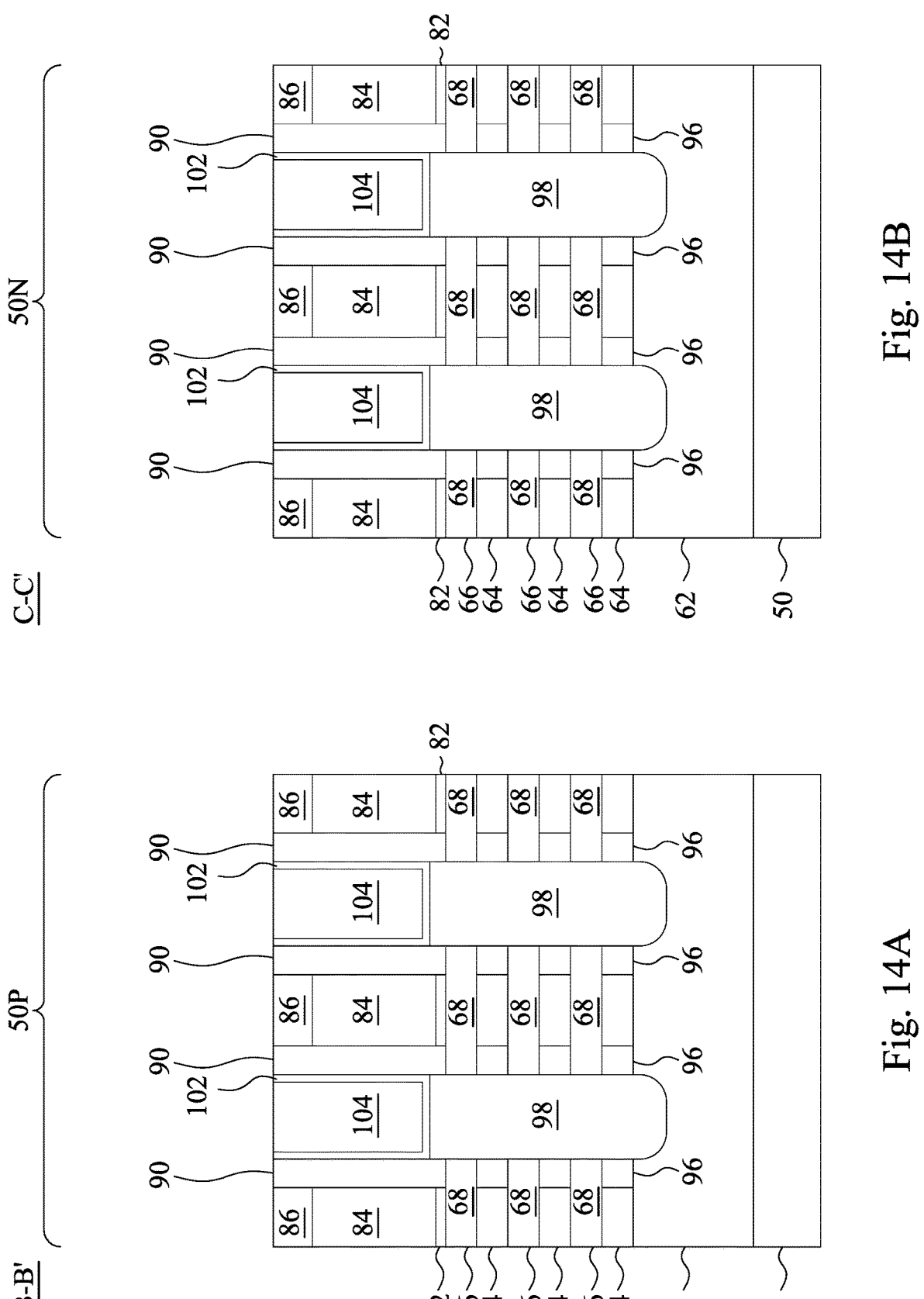

Referring back to FIG. 2B, the method M then proceeds to block S116 where a contact etch stop layer (CESL) and an inter-layer dielectric (ILD) layer are deposited over the epitaxial source/drain regions. With reference to FIGS. 14A and 14B, in some embodiments of block S116, a first inter-layer dielectric (ILD) 104 is deposited over the epitaxial source/drain regions 98, the gate spacers 90, the masks 86 (if present) or the dummy gates 84. The first ILD 104 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 90, and the masks 86 (if present) or the dummy gates 84. The CESL 102 may be formed of a dielectric material, such as silicon nitride, silicon oxide, silicon oxynitride, or the like, having a high etching selectivity from the etching of the first ILD 104. The CESL 102 may be formed by an any suitable method, such as CVD, ALD, or the like.

Subsequently, a removal process is performed to level the top surfaces of the first ILD 104 with the top surfaces of the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 90 along sidewalls of the masks 86. After the planarization process, the top surfaces of the gate spacers 90, the first ILD 104, the CESL 102, and the masks 86 (if present) or the dummy gates 84 are coplanar (within process variations). Accordingly, the top surfaces of the masks 86 (if present) or the dummy gates 84 are exposed through the first ILD 104. In some embodiments, the masks 86 remain, and the planarization process levels the top surfaces of the first ILD 104 with the top surfaces of the masks 86.

Figures 15A, 15B:
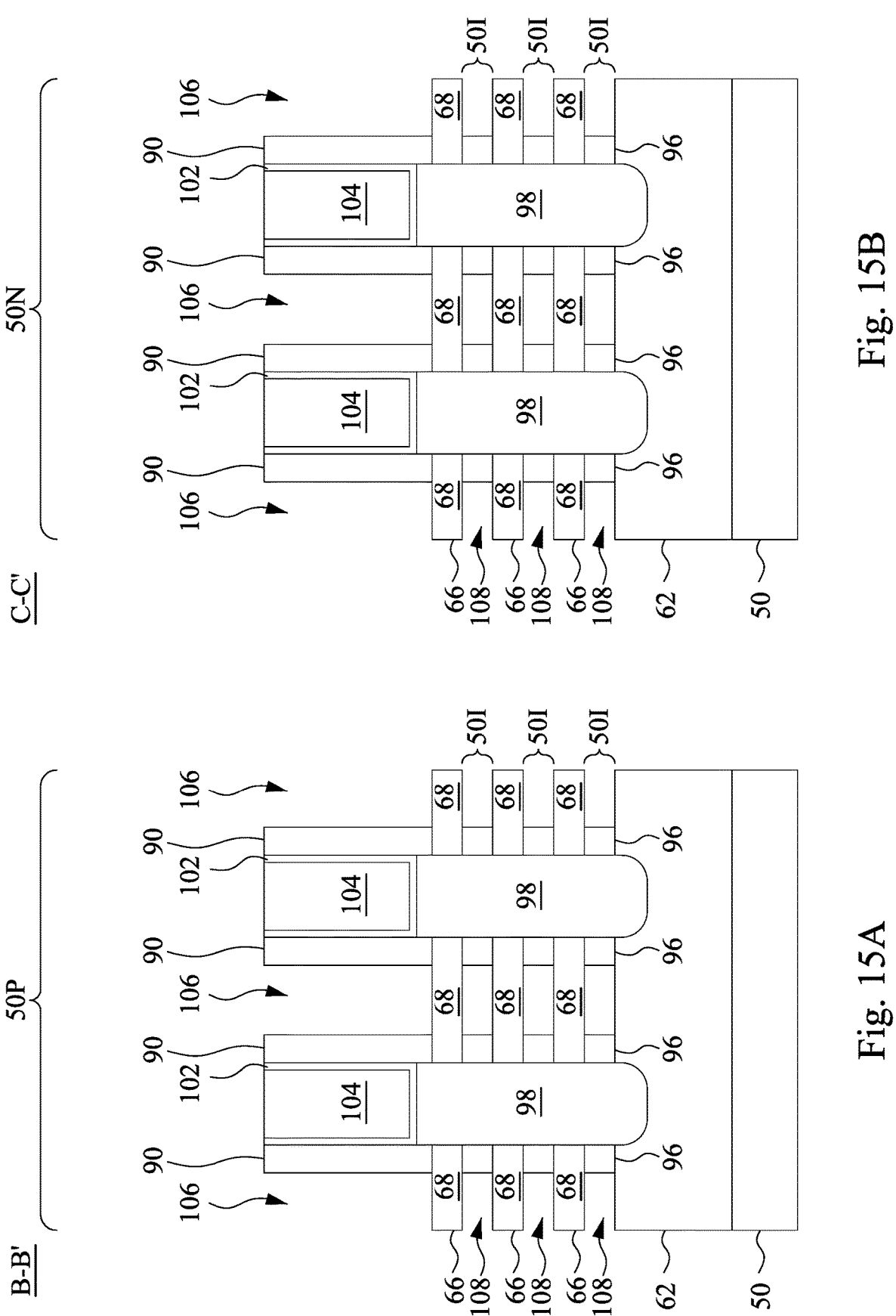

Referring back to FIG. 2B, the method M then proceeds to block S117 where the dummy gates and the first nanostructures are moved. With reference to FIGS. 15A and 15B, in some embodiments of block S117, the masks 86 (if present) and the dummy gates 84 are removed in an etching process, so that recesses 106 are formed. Portions of the dummy dielectrics 82 in the recesses 106 are also removed. In some embodiments, the dummy gates 84 are removed by an anisotropic dry etch process. For example, the etching process may include a dry etch process using reaction gas(es) that selectively etch the dummy gates 84 at a faster rate than the first ILD 104 or the gate spacers 90. During the removal, the dummy dielectrics 82 may be used as etch stop layers when the dummy gates 84 are etched. The dummy dielectrics 82 are then removed. Each recess 106 exposes and/or overlies portions of the channel regions 68. Portions of the second nanostructures 66 which act as the channel regions 68 are disposed between adjacent pairs of the epitaxial source/drain regions 98.

The remaining portions of the first nanostructures 64 are then removed to expand the recesses 106, such that openings 108 are formed in regions 501 between the second nanostructures 66. The remaining portions of the first nanostructures 64 can be removed by any acceptable etching process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etching process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second nanostructures 66.

Figures 16A, 16B:
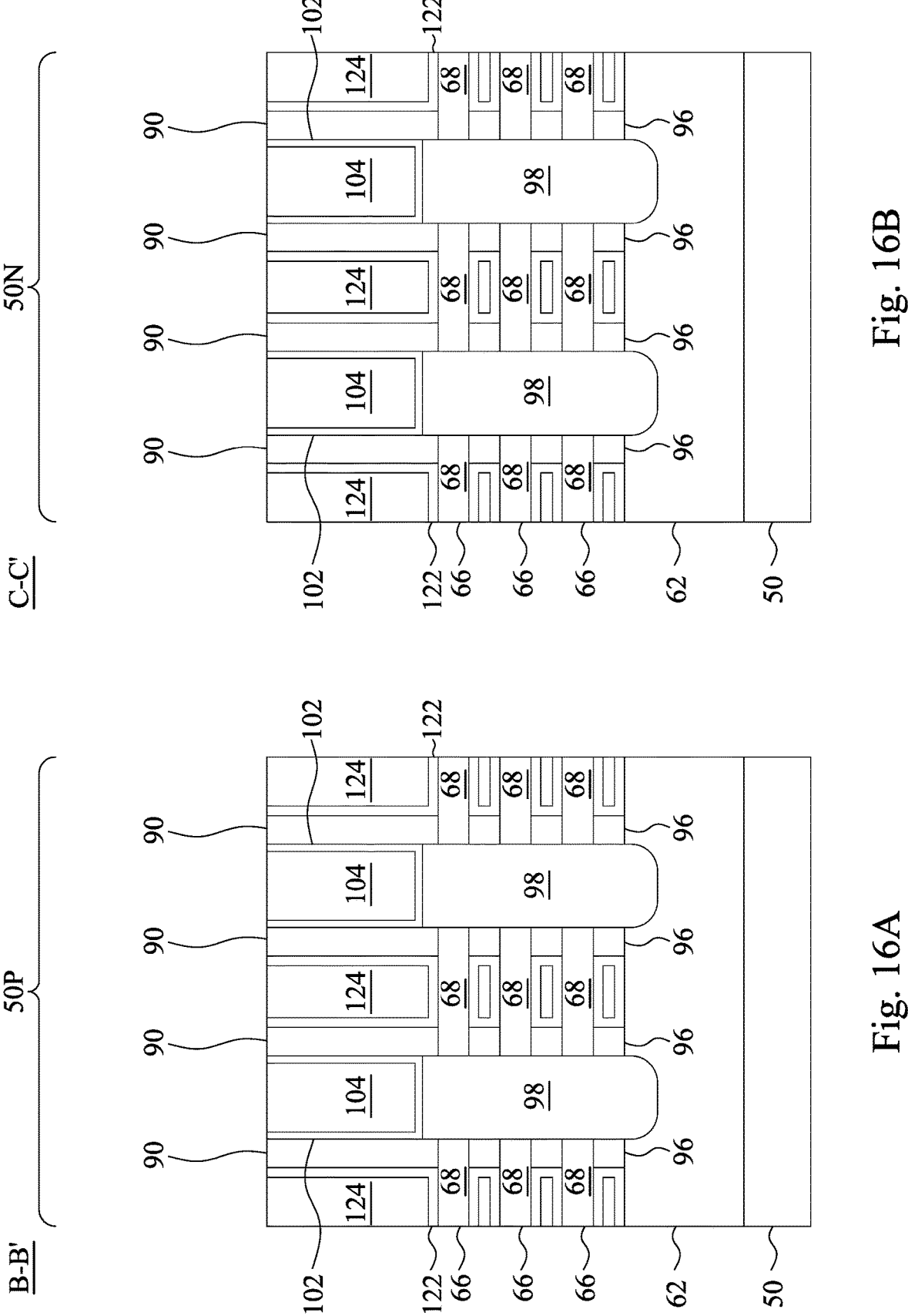

Referring back to FIG. 2B, the method M then proceeds to block S118 where gate structures are formed to wrap around the second nanostructures. With reference to FIGS. 16A and 16B, in some embodiments of block S118, a gate dielectric layer 112 is formed in the recesses 106. A gate electrode layer 114 is formed on the gate dielectric layer 112. The gate dielectric layer 112 and the gate electrode layer 114 are layers for replacement gates, and each wrap around all (e.g., four) sides of the second nanostructures 66.

The gate dielectric layer 112 is disposed on the sidewalls and/or the top surfaces of the fins 62; on the top surfaces, the sidewalls, and the bottom surfaces of the second nanostructures 66; and on the sidewalls of the gate spacers 90. The gate dielectric layer 112 may also be formed on the top surfaces of the first ILD 104 and the gate spacers 90. The gate dielectric layer 112 may include an oxide such as silicon oxide or a metal oxide, a silicate such as a metal silicate, combinations thereof, multi-layers thereof, or the like. The gate dielectric layer 112 may include a dielectric material having a k-value greater than about 7.0, such as a metal oxide or a silicate of hafnium, aluminum, zirconium, lanthanum, manganese, barium, titanium, lead, and combinations thereof. Although a single-layered gate dielectric layer 112 is illustrated in FIGS. 16A and 16B, as will be subsequently described in greater detail, the gate dielectric layer 112 may include any number of interfacial layers and any number of main layers.

The gate electrode layer 114 may include a metal-containing material such as titanium nitride, titanium oxide, tungsten, cobalt, ruthenium, aluminum, combinations thereof, multi-layers thereof, or the like. Although a single-layered gate electrode layer 114 is illustrated in FIGS. 16A and 16B, as will be subsequently described in greater detail, the gate electrode layer 114 may include any number of work function tuning layers, any number of barrier layers, any number of glue layers, and a fill material.

The formation of the gate dielectric layers 112 in the n-type region 50N and the p-type region 50P may occur simultaneously such that the gate dielectric layers 112 in each region are formed of the same materials, and the formation of the gate electrode layers 114 may occur simultaneously such that the gate electrode layers 114 in each region are formed of the same materials. In some embodiments, the gate dielectric layers 112 in each region may be formed by distinct processes, such that the gate dielectric layers 112 may be different materials and/or have a different number of layers, and/or the gate electrode layers 114 in each region may be formed by distinct processes, such that the gate electrode layers 114 may be different materials and/or have a different number of layers. Various masking steps may be used to mask and expose appropriate regions when using distinct processes. In the following description, at least portions of the gate electrode layers 114 in the n-type region 50N and the gate electrode layers 114 in the p-type region 50P are formed separately.

Subsequently, a removal process is performed to remove the excess portions of the materials of the gate dielectric layer 112 and the gate electrode layer 114, which excess portions are over the top surfaces of the first ILD 104 and the gate spacers 90, thereby forming gate dielectrics 122 and gate electrodes 124. In some embodiments, a planarization process such as a chemical mechanical polish (CMP), an etch-back process, combinations thereof, or the like may be utilized. The gate dielectric layer 112, when planarized, has portions left in the recesses 106 (thus forming the gate dielectrics 122). The gate electrode layer 114, when planarized, has portions left in the recesses 106 (thus forming the gate electrodes 124). The top surfaces of the gate spacers 90; the CESL 102; the first ILD 104; the gate dielectrics 122; and the gate electrodes are coplanar (within process variations). The gate dielectrics 122 and the gate electrodes 124 form replacement gates of the resulting nano-FETs. Each respective pair of a gate dielectric 122 and a gate electrode 124 may be collectively referred to as a "gate structure." The gate structures each extend along top surfaces, sidewalls, and bottom surfaces of a channel region 68 of the second nanostructures 66.

In order to activate the dopants in wells of a semiconductor substrate, an annealing process may be performed on the well. However, if the annealing temperature stays in a mid-temperature regime (e.g., temperature about 700-1000° C.) for longer than about 10 seconds, silicon interstitial clustering will increase in the wells, resulting in dislocation loop formation. Once the dislocation loops have been formed, they will be difficult to be repaired, even if the anneal temperature is raised to higher than 1000° C. The dislocation loop formation results in defective well regions, which in turn will result in defective epitaxy structures that are formed on it subsequently, which in turn reduces the yield of the semiconductor device.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides an annealing process including a flash anneal first followed by a rapid thermal anneal (RTA) well anneal. The flash anneal is mainly performed to repair silicon interstitial defects, and the followed RTA is mainly performed to activate the dopants in the wells. Specifically, the flash anneal is performed with a shortened time duration in a mid-temperature regime (about 700-1000° C.), which can suppress silicon interstitial defects to cluster and in turn allows for suppressing the dislocation loop formation and reducing an area density of dislocation loops.

In some embodiments, the method includes performing a well implantation process to dope a dopant into a semiconductor substrate; after performing the well implantation process, performing a flash anneal on the semiconductor substrate, the flash anneal including a first preheat step and a first annealing step after the first preheat step, the first preheat step performed at a preheat temperature ranging from about 200° C. to about 800° C., the first annealing step having a peak temperature ramp profile, the peak temperature ramp profile having a peak temperature ranging from about 1000° C. to about 1200° C.; after performing the flash anneal, performing a rapid thermal anneal (RTA) on the semiconductor substrate, the RTA including a second preheat step, the first preheat step of the flash anneal being performed for a shorter duration than the second preheat step of the RTA. In some embodiments, the first preheat step has a temperature ramp-up rate ranging from about 10 to about 150° C./s. In some embodiments, the preheat temperature is less than about 700° C. In some embodiments, the peak temperature is greater than about 1100° C. In some embodiments, the RTA includes a second annealing step having a spike temperature ramp profile, the spike temperature ramp profile has a spike temperature ranging from about 1000° C. to about 1200° C. In some embodiments, the spike temperature ramp profile of the RTA has a duration ranging from about 1 to about 500 seconds. In some embodiments, the method further includes forming an oxide layer after implanting the dopant and prior to performing the flash anneal.

In some embodiments, the method includes implanting a dopant into a semiconductor substrate; after implanting the dopant, performing a first anneal on the semiconductor substrate, the first anneal including a first preheat step and a first annealing step after the first preheat step, the first preheat step performed at a preheat temperature ranging from about 200° C. to about 800° C., wherein a time period performed at a temperature higher than about 700° C. for the first preheat step is less than about 10 seconds, the first annealing step has a peak temperature ramp profile, the peak temperature ramp profile has a peak temperature ranging from about 1000° C. to about 1200° C.; after performing the first anneal, performing a second anneal on the semiconductor substrate, the second anneal including a second annealing step having a spike temperature ramp profile, the spike temperature ramp profile having a spike temperature ranging from about 1000° C. to about 1200° C. In some embodiments, the second anneal includes a second preheat step, the first preheat step of the first anneal is performed for a shorter duration than the second preheat step of the second anneal. In some embodiments, the second preheat step of the second anneal is performed at the temperature lower than about 700° C. In some embodiments, the first anneal is a flash anneal, and the second anneal is a rapid thermal anneal. In some embodiments, the method further includes after performing the second anneal, forming epitaxial nanosheet channels over the semiconductor substrate; and forming a gate structure wrapping around the epitaxial nanosheet channels.

In some embodiments, the method includes forming an oxide layer over a semiconductor substrate; implanting a dopant into the semiconductor substrate through the oxide layer; after implanting the dopant, performing a first anneal on the semiconductor substrate, the first anneal including a first annealing step having a peak temperature ramp profile, the peak temperature ramp profile having a peak temperature ranging from about 1000° C. to about 1200° C.; after performing the first anneal, performing a second anneal on the semiconductor substrate, the second anneal including a second annealing step having a spike temperature ramp profile, the spike temperature ramp profile having a spike temperature ranging from about 1000° C. to about 1200° C. In some embodiments, the first anneal includes a preheat step performing before the first annealing step, the preheat step is performed at a preheat temperature ranging from about 200° C. to about 800° C., and a time period performed at a temperature above about 700° C. for the preheat step is less than about 10 seconds. In some embodiments, the first anneal further includes a first preheat step performed before the first annealing step, the second anneal further includes a second preheat step performed before the second annealing step, and the first preheat step of the first anneal is performed for a shorter duration than the second preheat step of the second anneal. In some embodiments, the peak temperature ramp profile of the first anneal has a half maximum full width ranging from about 1.5 to about 2.5 milliseconds. In some embodiments, the method further includes after performing the second anneal, removing the oxide layer by using a wet etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
performing a well implantation process to dope a dopant into a semiconductor substrate;
after performing the well implantation process, performing a flash anneal on the semiconductor substrate, the flash anneal including a first preheat step and a first annealing step after the first preheat step, the first preheat step performed at a preheat temperature ranging from about 200° C. to about 800° C., the first annealing step having a peak temperature ramp profile, the peak temperature ramp profile having a peak temperature ranging from about 1000° C. to about 1200° C.;
after performing the flash anneal, performing a rapid thermal anneal (RTA) on the semiconductor substrate, the RTA including a second preheat step, the first preheat step of the flash anneal being performed for a shorter duration than the second preheat step of the RTA; and
forming a gate structure over the semiconductor substrate, wherein the RTA is performed prior to forming the gate structure.

2. The method of claim 1, wherein the first preheat step has a temperature ramp-up rate ranging from about 10 to about 150° C./s.

3. The method of claim 1, wherein the preheat temperature is less than about 700° C.

4. The method of claim 1, wherein the peak temperature is greater than about 1100° C.

5. The method of claim 1, wherein the RTA includes a second annealing step having a spike temperature ramp profile, the spike temperature ramp profile has a spike temperature ranging from about 1000° C. to about 1200° C.

6. The method of claim 5, wherein the spike temperature ramp profile of the RTA has a duration ranging from about 1 to about 500 seconds.

7. The method of claim 1, further comprising:
forming an oxide layer after implanting the dopant and prior to performing the flash anneal.

8. A method, comprising:
implanting a dopant into a semiconductor substrate;
after implanting the dopant, performing a first anneal on the semiconductor substrate, the first anneal including a first preheat step and a first annealing step after the first preheat step, the first preheat step performed at a preheat temperature ranging from about 200° C. to about 800° C., wherein a time period performed at a temperature higher than about 700° C. for the first preheat step is less than about 10 seconds, the first annealing step has a peak temperature ramp profile, the peak temperature ramp profile has a peak temperature ranging from about 1000° C. to about 1200° C.; and
after performing the first anneal, performing a second anneal on the semiconductor substrate, the second anneal including a second preheat step and a second annealing step after the second preheat step, the second annealing step having a spike temperature ramp profile, the spike temperature ramp profile having a spike temperature ranging from about 1000° C. to about 1200° C., and a highest temperature in the second preheat step of the second anneal is lower than a highest temperature in the first preheat step of the first anneal.

9. The method of claim 8, wherein the first preheat step of the first anneal is performed for a shorter duration than the second preheat step of the second anneal.

10. The method of claim 9, wherein the second preheat step of the second anneal is performed at the temperature lower than about 700° C.

11. The method of claim 8, wherein the first anneal is a flash anneal, and the second anneal is a rapid thermal anneal.

12. The method of claim 8, further comprising:
after performing the second anneal, forming epitaxial nanosheet channels over the semiconductor substrate; and
forming a gate structure wrapping around the epitaxial nanosheet channels.

13. A method, comprising:
forming an oxide layer over a semiconductor substrate;
implanting a dopant into the semiconductor substrate through the oxide layer;
after implanting the dopant, performing a first anneal on the semiconductor substrate, the first anneal including a first annealing step having a peak temperature ramp profile, the peak temperature ramp profile having a peak temperature ranging from about 1000° C. to about 1200° C.;
after performing the first anneal, performing a second anneal on the semiconductor substrate, the second anneal including a second annealing step having a spike temperature ramp profile, the spike temperature ramp profile having a spike temperature ranging from about 1000° C. to about 1200° C.; and
forming a gate structure over the semiconductor substrate, wherein the second anneal is performed prior to forming the gate structure.

14. The method of claim 13, wherein the first anneal includes a preheat step performing before the first annealing step, the preheat step is performed at a preheat temperature ranging from about 200° C. to about 800° C., and a time period performed at a temperature above about 700° C. for the preheat step is less than about 10 seconds.

15. The method of claim 13, wherein the first anneal further includes a first preheat step performed before the first annealing step, the second anneal further includes a second preheat step performed before the second annealing step, and the first preheat step of the first anneal is performed for a shorter duration than the second preheat step of the second anneal.

16. The method of claim 13, wherein the peak temperature ramp profile of the first anneal has a half maximum full width ranging from about 1.5 to about 2.5 milliseconds.

17. The method of claim 13, further comprising:

after performing the second anneal, removing the oxide layer by using a wet etching process.

18. The method of claim 1, wherein a highest temperature in the second preheat step of the RTA is lower than a highest temperature in the first preheat step of the flash anneal.

19. The method of claim 8, further comprising:

forming an oxide layer after implanting the dopant and prior to performing the first anneal.

20. The method of claim 13, wherein the first anneal further includes a first preheat step performed before the first annealing step, the second anneal further includes a second preheat step performed before the second annealing step, and a highest temperature in the second preheat step of the second anneal is lower than a highest temperature in the first preheat step of the first anneal.

* * * * *